United States Patent [19]

Tokunoh et al.

[11] Patent Number: 5,371,386
[45] Date of Patent: Dec. 6, 1994

[54] SEMICONDUCTOR DEVICE AND METHOD OF ASSEMBLING THE SAME

[75] Inventors: Futoshi Tokunoh; Katsumi Satoh, both of Fukuoka, Japan

[73] Assignee: Mitsubishi Denki Kabushiki Kaisha, Tokyo, Japan

[21] Appl. No.: 47,436

[22] Filed: Apr. 15, 1993

[30] Foreign Application Priority Data

Apr. 28, 1992 [JP] Japan ............................ 4-110179
Sep. 7, 1992 [JP] Japan ............................ 4-238315

[51] Int. Cl.$^5$ ........................................ H01L 23/42
[52] U.S. Cl. ........................................ 257/181; 257/688
[58] Field of Search ................................ 257/181, 688

[56] References Cited

U.S. PATENT DOCUMENTS

| B 481,930 | 2/1976 | Rice . |
| 4,099,201 | 7/1978 | Mueller . |
| 4,775,916 | 10/1988 | Kouzuchi et al. ............ 361/388 |
| 5,121,189 | 6/1992 | Niwayama ................. 257/181 |

FOREIGN PATENT DOCUMENTS

| 0450980 | 10/1991 | European Pat. Off. . |
| 2361747 | 3/1978 | France . |
| 62-109327 | 5/1987 | Japan . |
| 64-39736 | 2/1989 | Japan . |
| 3-149880 | 6/1991 | Japan . |
| 4-114474 | 4/1992 | Japan . |

OTHER PUBLICATIONS

Patent Abstracts of Japan, vol. 6, No. 251 (E-147) (1129), Dec. 10, 1982, JP-A-57 149 743, Sep. 16, 1982.

Primary Examiner—Rolf Hille
Assistant Examiner—Roy Potter
Attorney, Agent, or Firm—Oblon, Spivak, McClelland, Maier & Neustadt

[57] ABSTRACT

In a semiconductor device, a semiconductor element is stored in a casing while being held by external electrodes through first and second electrodes. The outer peripheral edge of the first electrode plate is projected outwardly beyond that of the semiconductor element and a ring-shaped groove is provided in the first surface of the first electrode plate along the outer peripheral edge of the semiconductor element. An adhesive holding member is charged in the groove and the outer peripheral portion of the semiconductor element. Thus, the semiconductor element is fixed to the first electrode plate and is protected by the adhesive holding member covering its end portion.

19 Claims, 34 Drawing Sheets

F I G. 4 1
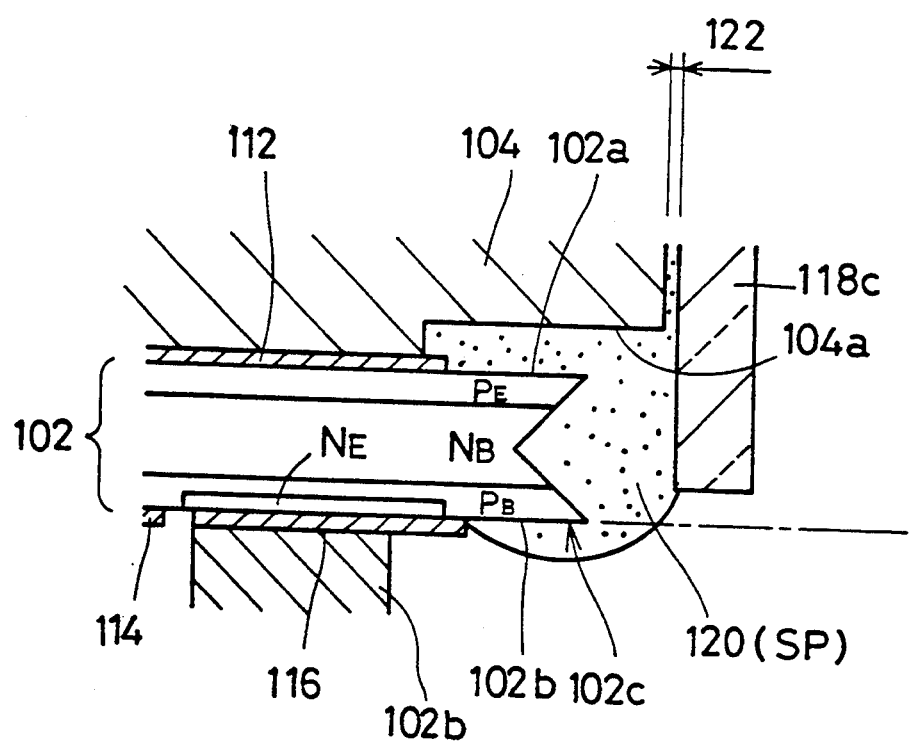

SEMICONDUCTOR DEVICE AND METHOD OF ASSEMBLING THE SAME

BACKGROUND OF THE INVENTION

1. Field of the Invention

The present invention relates to a semiconductor device in which electrodes are electrically brought into contact with a semiconductor element under pressure, and a method of assembling the same.

2. Description of the background art

The so-called flat pack type power semiconductor device has such a structure that a semiconductor element is held by external electrodes from both upper and lower sides.

Such a semiconductor device generates a considerable amount of heat since a high current flow through the semiconductor element, and if the same is used in such a structure condition that the aforementioned external electrodes are directly brought into contact with the semiconductor element under pressure, thermal stress may be caused between the external electrodes and the semiconductor element due to difference in thermal expansion coefficient therebetween, to break the semiconductor element.

In general, therefore, electrode plates for relieving the thermal stress are interposed between the external electrodes and the semiconductor element.

Since the thermal stress is increased if such electrode plates are fixed to the semiconductor element by solder or the like, employed is a full pressure contact type semiconductor device which keeps electrical connection therebetween only by mechanical contact.

FIG. 1 is a longitudinal sectional view of a center gate type pressure contact type semiconductor device which is disclosed in Japanese Patent Laid-Open Gazette No. 2-4672 (1990) as an example of a conventional full pressure contact type semiconductor device.

As shown in FIG. 1, this pressure contact type semiconductor device 1 comprises a semiconductor element 2, an anode electrode plate 5, a cathode electrode plate 6, an external anode electrode 10A, an external cathode electrode 10K. The semiconductor element 2 is held by the external anode and cathode electrodes 10A and 10K. Thus, the semiconductor element 2 is electrically brought into contact with the external anode electrode 10A through the electrode plate 5 as well as with the external cathode electrode 10K through the electrode plate 6 under pressure.

The semiconductor element 2 is formed by a discoidal silicon substrate which is provided with at least one P-N junction. The semiconductor element 2 includes two major surfaces, that is, upper and lower major surfaces. An anode metallization layer 3A is formed on the upper major surface while gate and cathode metallization layers 3G and 3K are formed on the lower major surface by using the same method. The gate metallization layer 3G is provided on a central portion as a gate electrode and the cathode metallization layer 3K is provided around the same as a cathode electrode.

The outer peripheral edge portion of the semiconductor element 2 is covered with a protective member 4. The protective member 4 is of ring shape concentrically with the semiconductor substrate 2 and has an outer diameter which coincides with an inner diameter of a casing 7. Hence, when the semiconductor element 2 is inserted into the casing 7, the semiconductor element 2 is protected from the inner wall of the casing 7 and is located in the casing 7 with high accuracy.

Outer peripheral surfaces of the anode and cathode electrode plates 5 and 6 are engaged with the inner peripheral surface of the protective member 4, to be located with respect to the semiconductor element 2.

The conductive external anode electrode 10A includes a base portion 11A and a convex portion 12A. A metal flange 13A is fixed to the outer peripheries of the base portion 11A. The conductive external cathode electrode 10K is identical in structure to the anode electrode 10A.

The casing 7, which is made of a ceramic material in the form of a cylinder, stores the electrode plates 5 and 6 and the convex portions 12A and 12K of the external electrodes 10A and 10K for holding the both major surfaces of the semiconductor element 2 from upper and lower sides, and thereafter the flanges 13A and 13K are fixed to upper and lower end surfaces of the casing 7 by brazing respectively. Thus, the semiconductor element 2 and the electrode plates 5 and 6 are fixed in the casing 7 while being held by the external electrodes 10A and 10K.

The cathode electrode plate 6 has a through hole 8 in its center while the external cathode electrode 10K being provided with a hole 9 in correspondence thereto, whereby an engaging hole is defined by the through hole 8 and the hole 9. Hence, a gate electrode holder 14 is slidably engaged in the engaging hole.

An internal gate electrode 15 is connected to a lead wire 16, which passes through a head portion of the gate electrode holder 14 and is drawn out to the exterior of the casing 7 through an insulating tube 17 passing through the casing 7, to be connected to an external gate electrode 18 by welding.

The gate electrode holder 14 is made of insulating material, and its lower end is in contact with and upwardly urged by a spring 19. As the result, the internal gate electrode 15 supported by the gate electrode holder 14 is brought into pressure contact with the gate metallization layer 3G, to be electrically connected with the same.

When the pressure contact type semiconductor device I having such a structure is employed in a prescribed apparatus, the pressure contact type semiconductor device 1 is inserted between an anode member 20A and a cathode member 20K of the prescribed apparatus. These anode and cathode members 20A and 20K are urged by external springs (not shown) along arrows shown in the figure, so that the upper surface of the cathode member 20K comes into pressure contact with the external cathode electrode 10K while the lower surface of the anode member 20A comes into pressure contact with the external anode electrode 10A. Thus, the cathode member 20K is reliably electrically connected to the cathode metallization layer 3K through the external cathode electrode 10K and the cathode electrode plate 6 while the anode member 20A is also reliably electrically connected to the anode metallization layer 3A through the external anode electrode 10A and the anode electrode plate 6.

The external gate electrode 18 is also connected to a gate electrode connecting member (not shown) of the applied apparatus.

When voltages are applied to the anode member 20A and the cathode member 20K in the pressure-connected state, a current flows through the interior of the semiconductor device 1 so that the semiconductor element 2 generates heat, which in turn is transferred through the electrode plates 5 and 6 and the external electrodes 10A and 10K to the anode member 20A and the cathode member 20K, so as to be carried away.

The electrode plates 5 and 6 between the external electrodes 10A and 10K and the semiconductor element 2 relieve the thermal stress therebetween, resulting in prevention against serious damages to the semiconductor element 2.

In the aforementioned structure of the conventional semiconductor device 1, however, the semiconductor element 2 is so infirmly fixed in the casing 7 that the semiconductor element 2 may be displaced from the electrode plates 5 and 6 and may be broken when the semiconductor device 1 is carried in a state being detached from the applied apparatus.

The protective member 4 acts to protect the outer peripheral edge of the semiconductor element 2 in addition to location of the electrode plates 5 and 6 as hereinabove described. Thus, a locational accuracy depends on the configuration of the protective member 4. However, the protective member 4 is restricted in applicable material, and hence it is so difficult to improve working accuracy of the protective member 4 that clearances are defined between the inner peripheral surface of the protective member 4 and the outer peripheries of the electrode plates 5 and 6 as shown in FIG. 1. As a result, the clearances cause displacement in carriage of the semiconductor device 1.

Assuming that an electrode plate 5 is rightwardly displaced as shown in FIG. 2, for example, a couple moment M is applied to a semiconductor element 2 by end portions of the electrode plates 5 and 6 if an impact or vibration is applied to a semiconductor device 1 from the exterior during carriage thereof. In general, a semiconductor element 2 is formed by a thin silicon substrate of about several hundred μm in thickness, and is mechanically so fragile that the same may be immediately broken upon application of the aforementioned couple moment M.

In general, therefore, a holder 21 shown in FIG. 3 is employed to carry the semiconductor device 1 under pressure. The holder 21 for pressure-carriage comprises an end plate 22 and bolts 23 which are upwardly provided on this end plate 22 so that upper portions thereof pass through both end portions of a downwardly warped plate spring 24, which in turn is fastened by nuts 25.

The semiconductor device 1 is fixed to the holder 21 in the following manner: First, the semiconductor device 1 is placed on the upper surface of the end plate 22 through a protective disc 26a. Next, another protective disc 26b is placed on the semiconductor device 1, and then the nuts 25 are tightened to downwardly move the plate spring 24. Hence, a lower curved portion 24a of the plate spring 24 urges the upper surface of the protective disc 26b downwardly, to thereby fix the semiconductor device 1.

Thus, the semiconductor device 1 can be carried while being held by the holder 21, whereby the electrode plates 5 and 6 will not be displaced during carriage dissimilarly to the above, and no couple moment M as shown in FIG. 2 is applied to break the semiconductor element 2 even if an impact is applied to the semiconductor device 1 from the exterior.

However, it is extremely troublesome to hold a number of semiconductor devices 1 one by one in such holders 21 every carriage, while a transportation space is increased by such holders 21, and hence this means liar holding the semiconductor device 1 is unsuitable for mass transportation.

Further, specific consideration is required for attaching and detaching the semiconductor device 1 to and from such a holder 21 and mounting the same on an applied apparatus, not to apply a large impact thereto.

SUMMARY OF THE INVENTION

The present invention is directed to a semiconductor device comprising: a semiconductor element having first and second surfaces; a first electrode provided on the first surface of the semiconductor element; a second electrode provided on the second surface of the semiconductor element; a first electrode plate having first and second surfaces, the first surface of the first electrode plate being in contact with the first electrode; a second electrode plate having first and second surfaces, the first surface being in contact with the second electrode; a first external electrode facing to the second surface or the first electrode plate, to be in contact with the first electrode plate; a second external electrode facing to the second surface of the second electrode plate, thereby to be in contact with the second electrode plate; and an adhesive holding member for fixing the semiconductor element to the first electrode plate, wherein the first electrode plate is formed such that the outer peripheral portion of the first electrode plate projects outwardly beyond the semiconductor element, a stepped portion is provided in the first surface of the first electrode plate along the outer peripheral edge of the semiconductor element such that a line, which is projected the outer peripheral edge of the semiconductor element on the first surface of the first electrode plate, is located on the stepped portion, and the adhesive holding member is charged in the stepped portion and the outer peripheral portion of the semiconductor element, whereby the outer peripheral portion thereof is protected by the adhesive holding member.

In an aspect to the present invention, a semiconductor device comprises: a semiconductor element having first and second surfaces; a first electrode being provided on the first surface of the semiconductor element; a second electrode being provided on the second surface of the semiconductor element; a first electrode plate having a first surface which is brought into contact with the first electrode and a second surface; a second electrode plate having an outside dimension being larger than the first electrode plate, the second electrode plate having a first surface being brought into contact with the second electrode and a second surface; and an insulating member being engageable with an outer peripheral portion of the second electrode, wherein a space portion is defined by the insulating member, the second electrode plate and the semiconductor element, the space portion being filled up with an insulating bonding member so that the semiconductor element is fixed to at least the second electrode plate and the insulating member while the outer peripheral end portion of the semiconductor element is protected by the insulating bonding member.

The present invention is also directed to a method of assembling a semiconductor device which comprises a semiconductor element having first and second surfaces, a first electrode provided on the first surface of the semiconductor element, a second electrode provided on the second surface of the semiconductor element, a first electrode plate having first and second surfaces, a second electrode plate having first and second surfaces, a first external electrode, a second external electrode, and a casing having an opposite pair of opening portions, wherein the first electrode plate is formed such that the outer peripheral portion of the first electrode plate projects outwardly beyond the semiconductor element, and wherein a stepped portion is provided in the first surface of the first electrode plate along the outer peripheral edge of the semiconductor element such that a line, which is projected the outer peripheral edge of the semiconductor element on the first surface of the first electrode plate, is located on the stepped portion. The method comprises: (a) a step of preparing a casing; (b) a step of fixing a semiconductor element to the first electrode plate, the step (b) including: (b-1) a step of placing the first electrode plate to upwardly direct the first surface having the stepped portion and placing the semiconductor element on a prescribed position of the first surface of the first electrode plate, (b-2) a step of supplying an adhesive holding member to the stepped portion and the outer peripheral portion of the semiconductor element for charging the overall the outer peripheral potion of the semiconductor element and the stepped portion of the first electrode plate with the adhesive holding member, and (b-3) a step of heating the semiconductor element, the first electrode plate and the adhesive holding member at a prescribed temperature for a constant time thereby solidifying the adhesive holding member; (c) a step of storing the second external electrode, second electrode plate, the first electrode plate to which the semiconductor element is fixed and the first external electrode; and (d) a step of fixing the first and second external electrodes to end portions of respective the opening portions of the casing.

In an aspect of the present invention, a method of assembling a semiconductor device comprising: a semiconductor element having first and second surfaces; a first electrode being provided on the first surface of the semiconductor element; a second electrode being provided on the second surface of the semiconductor element; a first electrode plate having a first surface which is brought into contact with the first electrode and a second surface; and a second electrode plate having an outside dimension being larger than the first electrode plate, the second electrode plate having a first surface being brought into contact with the second electrode and a second surface, comprises: (a) a step of preparing a casing having an opposite pair of opening portions; (b) a step of fixing the semiconductor element to the second electrode plate and an insulating member, the insulating member having a stop portion inwardly projected from the inner peripheral surface thereof so that the second electrode plate is engageable in the insulating member, the step (b) including: (b-1) a step of placing the insulating member, and then engaging the second electrode plate in the insulating member so that the first surface of the second electrode plate is directed upwardly, (b-2) a step of placing the semiconductor element on the first surface of the second electrode plate being engaged in the insulating member, (b-3) a step of filling up a space portion with an insulating bonding member, the space portion being defined by an inner peripheral surface of the insulating member, the upper surface of the second electrode plate and an outer peripheral end portion of the semiconductor element, and (b-4) a step of solidifying the bonding insulating member by obtaining such a combination that the semiconductor element is fixed to the insulating member and the second electrode plate; (c) a step of storing a first external electrode plate, the first electrode plate, the combination and the second external electrode plate in the casing; and (d) a step of fixing the first and second external electrodes to respective end portions of the opening portions of the casing.

Accordingly, an object of the present invention is to obtain a semiconductor device having a simple structure which causes no breakage of a semiconductor element during carriage with no specific instrument, and a method of assembling the same.

Another object of the present invention is to provide a semiconductor device in which a semiconductor element is fixed with sufficient bond strength so that high reliability can be attained in a simple operation, and a method of assembling the same.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 41 is a partially enlarged view of a fifth modification of the semiconductor device according to the second embodiment;

DESCRIPTION OF THE PREFERRED EMBODIMENTS

A. First Embodiment

Figure 4:
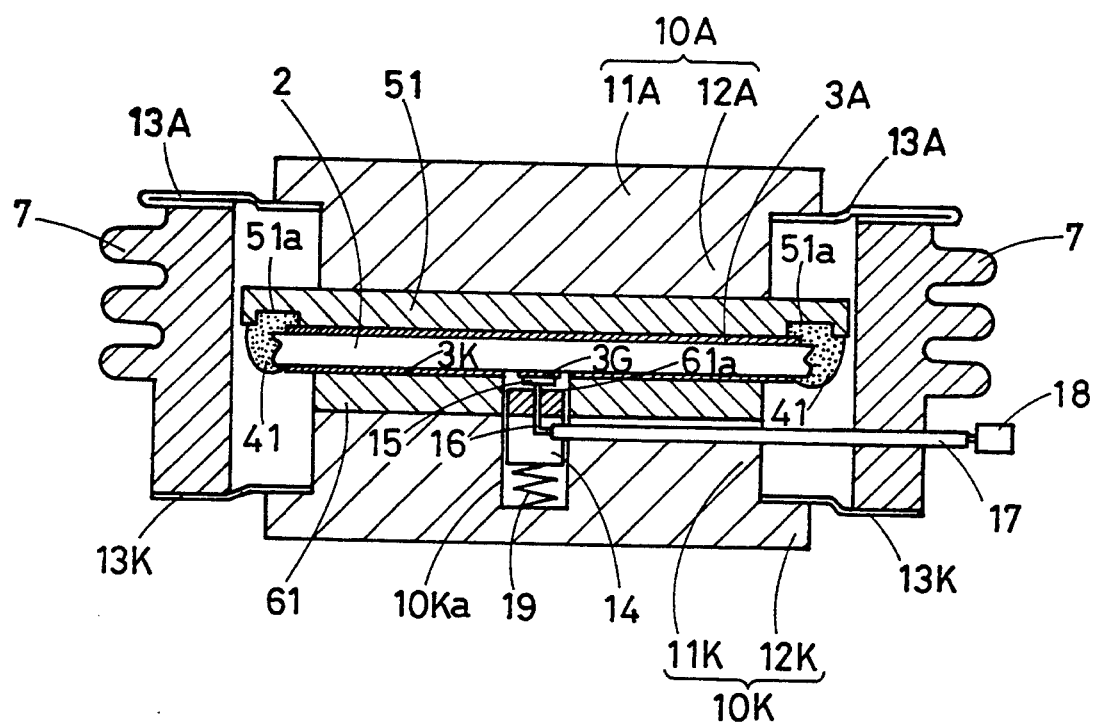
FIG. 4 is a longitudinal section view of a pressure contact type semiconductor device according to a first embodiment of the present invention.
Figure 5:
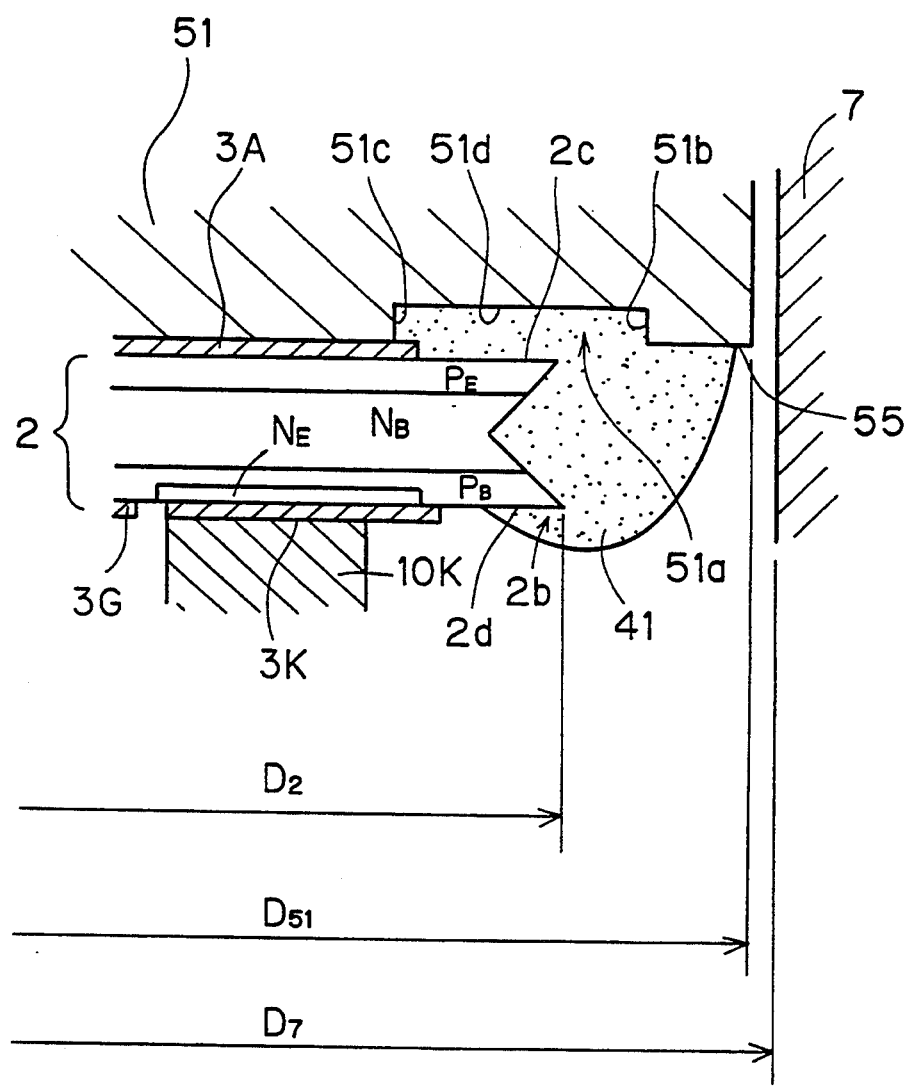
FIG. 5 shows an anode electrode plate as viewed from the ring-shaped groove.

FIG. 4 is a longitudinal section view of a pressure contact type semiconductor device 100 according to a first embodiment of the present invention. FIG. 5 is an enlarged sectional view of the semiconductor device of FIG. 4.

Referring to FIG. 5, a semiconductor element 2 is formed by a silicon substrate and is provided with at least one P-N junction. For example, the semiconductor element 2 is provided with a mesa type thyristor. More precisely, a P-emitter layer PE and a P-base layer PB are formed on upper and lower major surface sides of the semiconductor element 2 respectively, while an N-base layer NB is formed between the P-emitter layer PE and the P-base layer PB. Further, an N-emitter layer NE is partially provided in a lower portion of the P-base layer PB. In this mesa type thyristor, the P-N junction is exposed on a side surface of an outer peripheral portion 2b of the semiconductor element 2, and hence it is particularly important to prevent the side surface from contamination.

Further, a metal such as aluminum is selectively vapor-deposited on a portion of an upper major surface 2c of the semiconductor element 2, to define an anode metallization layer 3A which serves as an anode electrode. On the other hand, a gate metallization layer 3G for serving as a gate electrode and a cathode metallization layer 3K for serving as a cathode electrode are formed on a central portion of a lower major surface 2d and a peripheral region thereof, respectively, in a similar manner to the anode metallization layer 3A.

Figure 6:
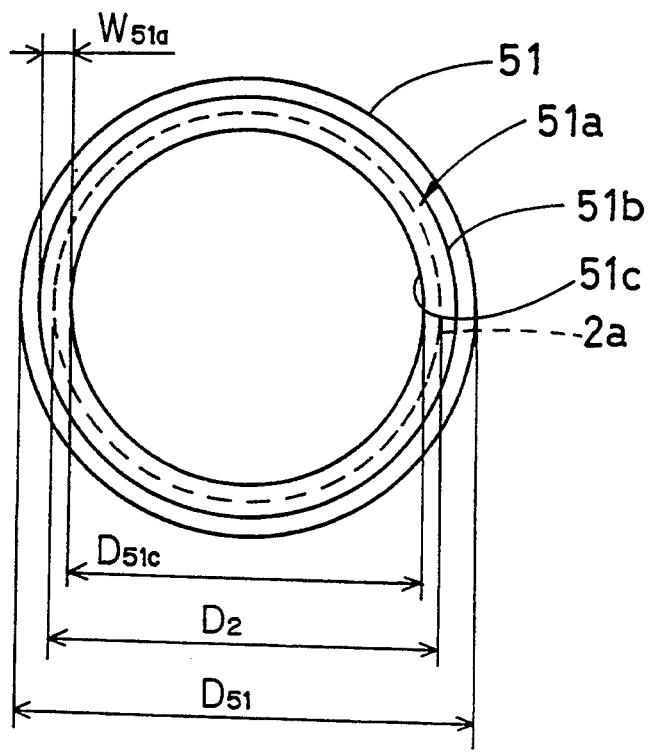
FIG. 6 is a plan view of an anode electrode plate.

FIG. 6 is a plan view of a first electrode plate. An anode electrode plate is designed in a disc configuration. Referring to FIG. 6, a dotted line 2a shows a virtual line which is drawn when the outer peripheral edge of the semiconductor element 2 is projected on the anode electrode plate 51. The diameter D51 of the plate 51 is lager than the diameter D2 of the semiconductor element 2. The plate 51 has a lower major surface 55 in which a ring-shaped groove 51a including an outer wall 51b, an inner wall 51c and a bottom surface 51d (see FIG. 5) is formed concentrically, such that the projected portion (dotted line) 2a of the outer peripheral edge of the semiconductor element 2 is located above the bottom surface 51d of the ring-shaped groove 51a. Further, the diameter D51 is slightly smaller than the inner diameter W7 of a cylindrical casing 7 made of ceramic.

As hereinafter described, an adhesive holding member 41 of silicon rubber or polyimide is charged to cover this ring-shaped groove 51a and front and back sides of the outer peripheral portion of the semiconductor element 2. Thus, the semiconductor element 2 is protected by the adhesive holding member 41 on its end portion and the upper and lower sides of its outer peripheral portion and reliably fixed to and reinforced by the anode electrode plate 51, to sufficiently attain strength against an external impact.

The material such as silicon rubber or polyimide still has constant elasticity after solidification, whereby the adhesive holding member 41 relieves thermal stress which may be caused between the anode electrode plate 51 and the semiconductor element 2 due to heating of the semiconductor element 2, so that the semiconductor element 2 is not broken by such thermal stress.

On the other hand, a cathode electrode plate 61 is provided with a through hole 61a in its central portion while a cathode electrode 10K being provided with a hole 10Ka. The through hole 61a and the hole 10Ka have the same sectional shape, and defines an engaging hole in which a gate electrode holder 14 is slidably engaged.

An internal gate electrode 15 is connected with an end of a lead wire 16, the other end of which passes through a head portion of the gate electrode holder 14 and is drawn to the exterior of the casing 7 through an insulating tube 17 passing through the casing 7, to be welded to an external gate electrode 18 on its end portion.

A spring 19 and the gate electrode holder 14 which is made of insulating material are placed into the engaging hole in this order. Hence, upwardly biasing force from the spring 19 is applied to the gate electrode holder 14, resulting in that the internal gate electrode 15 supported by the gate electrode holder 14 is firmly brought into contact with the gate metallization layer under pressure, to be electrically connected with the same.

The gate electrode holder 14 is further engaged in the engaging hole which is defined by the through hole 61a of the second electrode plate 61 and the hole 10Ka of the external cathode electrode 10K, whereby the gate electrode holder 14 serves as the so-called stake to locate the second electrode plate 61 not to be displaced from a prescribed position of the external cathode electrode 10K. Thus, the cathode electrode plate 61 will not be displaced to exert a bad influence on the semiconductor element 2 during carriage of the semiconductor device 100.

In the embodiment, the gate electrode holder 14, the through hole 61a and the hole 10Ka define location means as a whole, and there is a small displacement between the through hole 61a and the hole 10Ka since the gate electrode holder 14 must freely slide in the through hole 61a and the hole 10Ka. Thus, the cathode electrode plate 61 may be misaligned with the external cathode electrode 10K due to the displacement. However, the cathode electrode plate 61 is so formed that its diameter is sufficiently smaller than the diameter D51c (FIG. 6) of the inner periphery wall 51c, whereby an end portion of the cathode electrode plate 61 will not be moved to the position of the ring-shaped groove 51a to cause the couple moment M (FIG. 2) in the semiconductor device 2, dissimilarly to the prior art.

Figure 7:
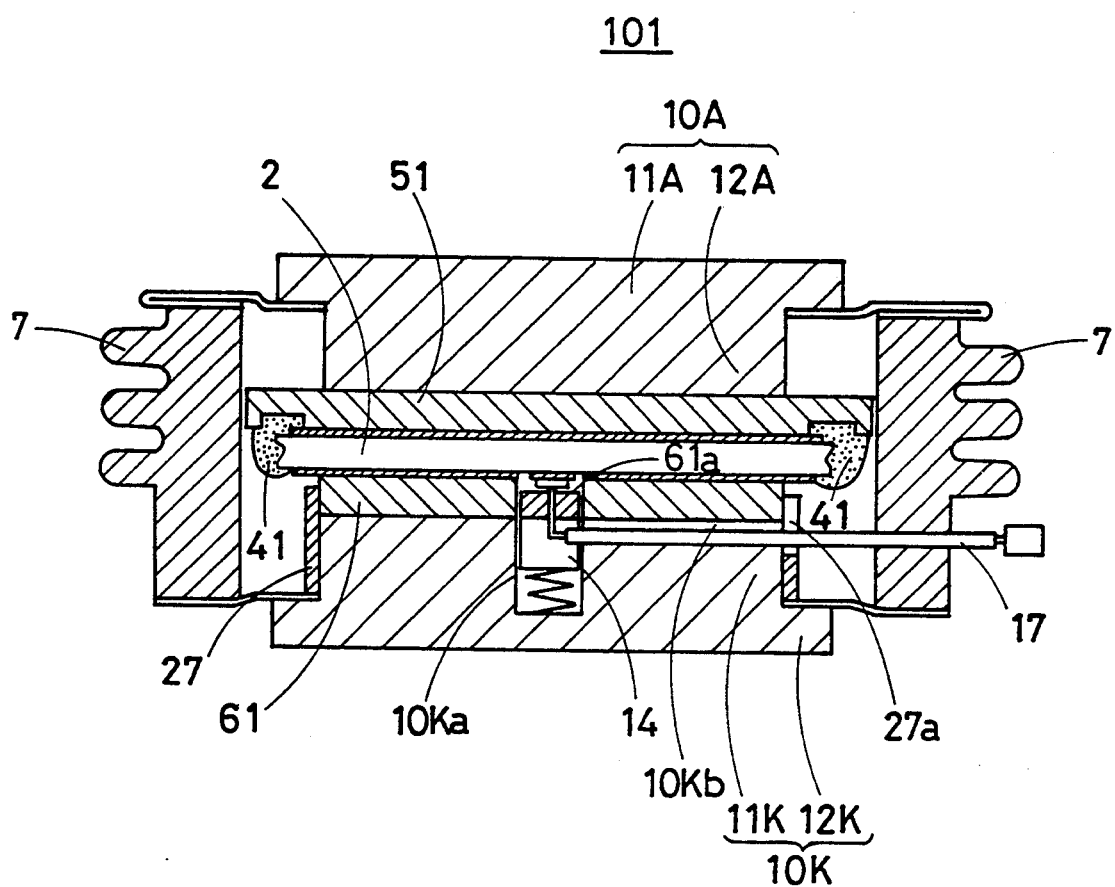
FIG. 7 is a longitudinal section view of a pressure contact type semiconductor device according to another embodiment of the present invention.

When it is necessary to completely eliminate such displacement or in the case of a semiconductor device having no center gate electrode dissimilarly to the embodiment shown in FIG. 4, however, it is possible to implement such elimination by completely matching diameters of a cathode electrode plate 61 and a convex portion 11K of an external cathode electrode 10K as shown in a semiconductor device 101 of FIG. 7, engaging a location ring 27 around the internal convex portion 11K of the external cathode electrode 10K as shown in FIG. 7 and further engaging the cathode electrode plate 61 from above the location ring 27.

Figure 8:
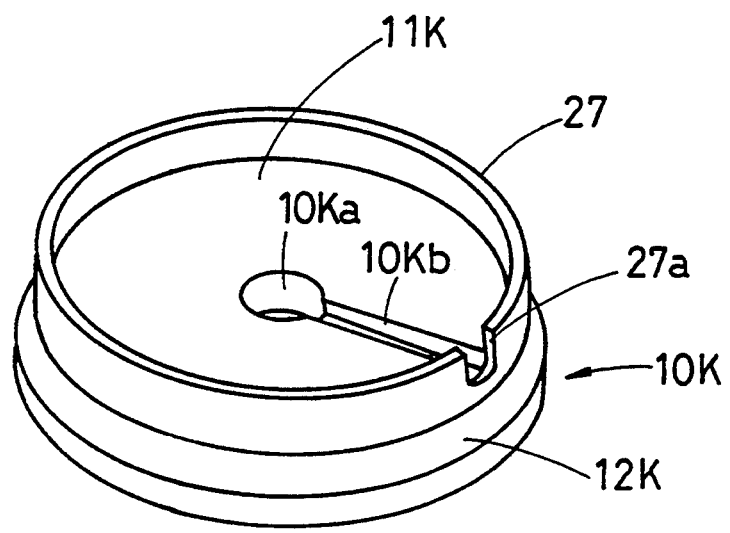
FIG. 8 is a perspective view showing a state of engaging a location ring in a convex portion of an external cathode electrode.

The location ring 27 is provided with a notch 27a along the sectional shape of a groove 10Kb of the external cathode electrode 10K as shown in FIG. 8, so that the same can pass through an insulating tube 17.

As to the external anode electrode 10A and the external cathode electrode 10K, further, ring-type flanges 13A and 13K of metals are fixed to outer peripheries of respective base portions 11A and 11K, so that the flanges 13A and 13K are fixed to opening end portions of the casing 7 respectively by brazing.

Figure 9:
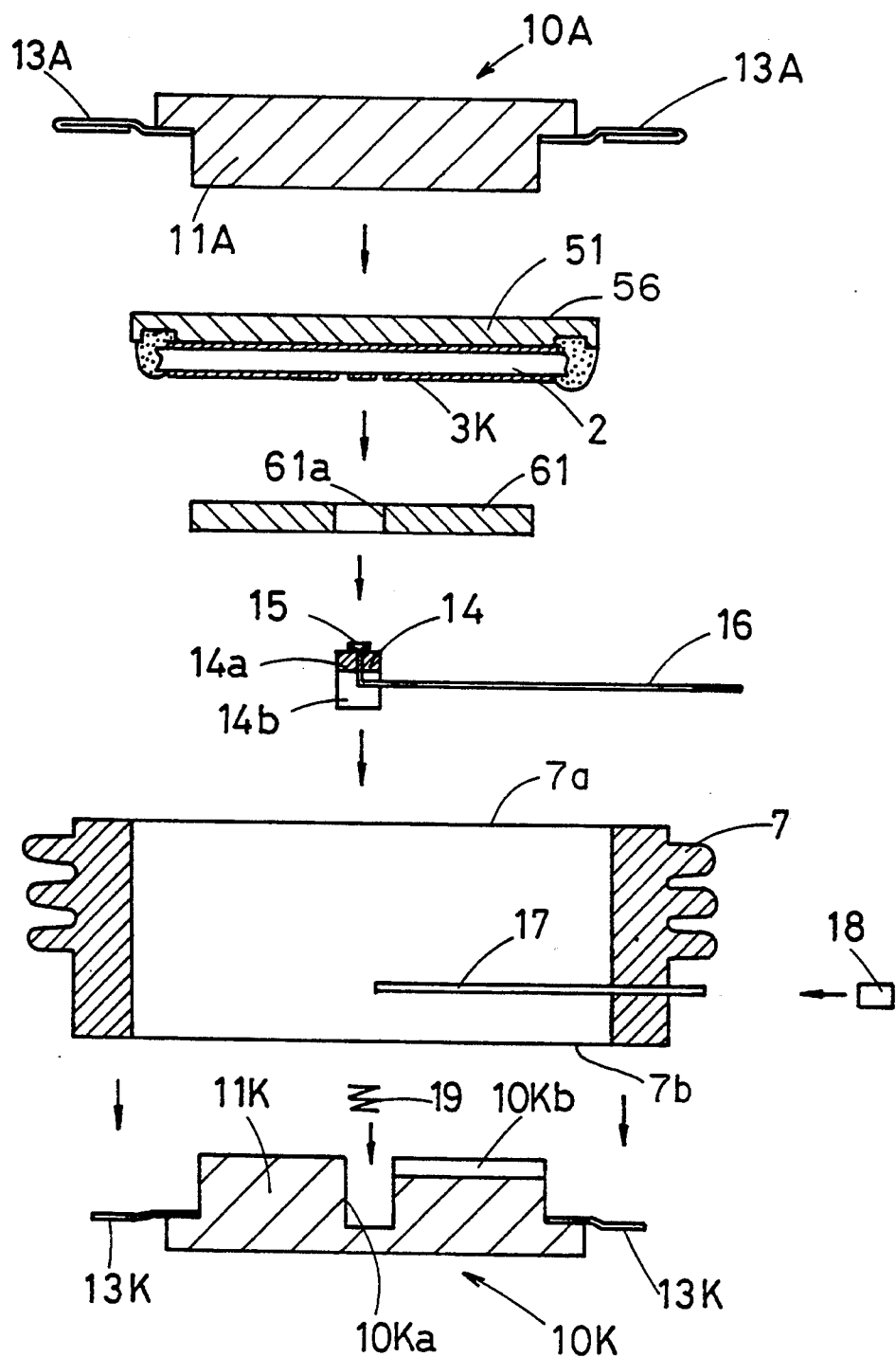
FIG. 9 is an exploded assembly diagram of the semiconductor device of FIG. 4.

A procedure of assembling the semiconductor device 100 of FIG. 4 will be now described with reference to an exploded assembly drawing shown in FIG. 9.

(1) First prepared is the casing 7 having upper and bottom openings 7a and 7b, in which the insulating tube 17 horizontally passes through a prescribed position of its cylindrical portion.

(2) The external cathode electrode 10K, to whose periphery the ring-shaped flange 13K is fixed, is so placed as to upwardly direct its convex portion 11K, and the spring 19 is inserted in the hole 10Ka formed.

(3) The casing 7 is placed on the flange 13K so that the insulating tube 17 is located on the position of the groove 10Kb which is formed on the upper surface of the external cathode electrode 10K.

(4) The gate electrode holder 14, on whose head portion the internal gate electrode 15 is mounted, is engaged in the hole 10Ka of the external cathode electrode 10K. At this time, the lead wire 16 connected with the internal gate electrode 15 is passed through the insulating tube 17.

Figure 10:
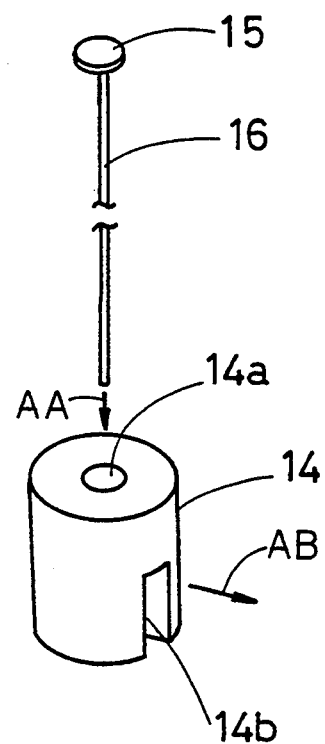
FIG. 10 is a perspective view showing a procedure of mounting an internal gate electrode on a gate electrode holder.

FIG. 10 illustrates a manner of inserting the lead wire 16 into the gate electrode holer 14. The end of the lead wire 16 is inserted into a through hole 14a as indicated by the arrow AA, resulting in fixing the gate electrode 15 on the upper portion of the gate electrode holder 14. The lead wire portion passing through the through hole 14a is further directed as indicated by the arrow AB, and is drawn out from a notch 14b formed in a lower portion of the gate electrode holder 14.

(5) The cathode electrode plate 61 is placed on the external cathode electrode 10K so that the head portion of the gate electrode holder 14 is engaged in the through hole 61a formed in its center.

(6) Then, the semiconductor element 2, whose outer peripheral portion is fixed to the anode electrode plate 51, is inserted in the casing 7 while downwardly directing the surface of the cathode metallization layer 3K, to be placed on the upper surface of the aforementioned cathode electrode plate 61.

Thus, the semiconductor element 2 is previously fixed to the anode electrode plate 51, and a method of fixing the same will be now described with reference to FIGS. 11-13.

First, the anode electrode plate 51 is so placed as to upwardly direct the surface having the ring-shaped groove 51a. The semiconductor element 2 is placed on its central portion to downwardly direct the anode metallization layer 3A, and a weight 28 for preventing displacement is placed further thereon (FIG. 11).

Figure 12:
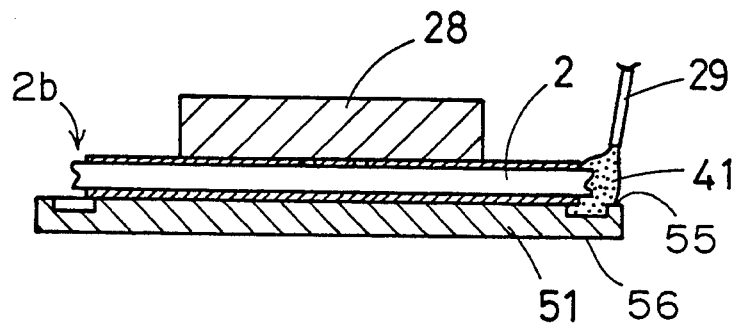
Figure 13:
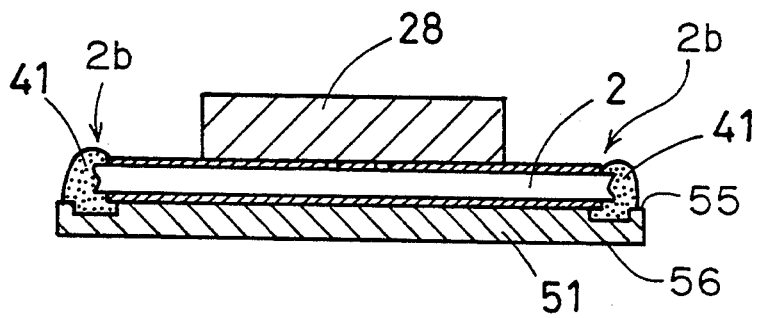

Then, the adhesive holding member 41 is poured from the forward end of a nozzle 29 which is coupled to adhesive holding member supply means (not shown) along the ring-shaped groove 51a and the outer peripheral portion of the semiconductor element 2 (FIG. 12), and heat treatment is performed under a condition carrying the weight 28 at about 200° C. to 300° C. for 2 to 8 hours, thereby solidifying the adhesive holding member 41 (FIG. 13).

At this time, the inner periphery wall 51c of the ring-shaped groove 51a is formed to be inward beyond the outer peripheral edge of the semiconductor element 2. Hence, the adhesive holding member 41 covers the semiconductor element 2 over upper and lower portions of its outer peripheral edge to sufficiently protect the end portion of the semiconductor element 2. In addition, the adhesive holding member 41 fills up the ring-shaped groove 51a to be solidified, such that the semiconductor element 2 is reliably fixed with no apprehension for displacement or detachment.

This adhesive holding member 41 is prepared from insulating silicon rubber or polyimide and still has constant elasticity upon solidification, whereby the same is excellent as a protective member for the end portion of the semiconductor element 2.

(7) The external anode electrode 10A is inserted through the upper opening 7a in the casing 7 so as to downwardly direct the convex portion 11A, resulting in contact with an upper surface 56 of the anode electrode plate 51. Thereafter, the flange 13A is matched with the upper end portion of the casing 7.

(8) The flange 13K of the external cathode electrode 10K and the flange 13A of the external anode electrode 10A are fixed to the end surfaces of the casing 7 by brazing respectively.

(9) Finally, the external gate electrode 18 is fixed by welding to the end portion of the lead wire 16 which is passed through the insulating tube 17 to be exposed to the exterior.

Thus, the semiconductor device 100 shown in FIG. 4 is assembled.

Figure 14:
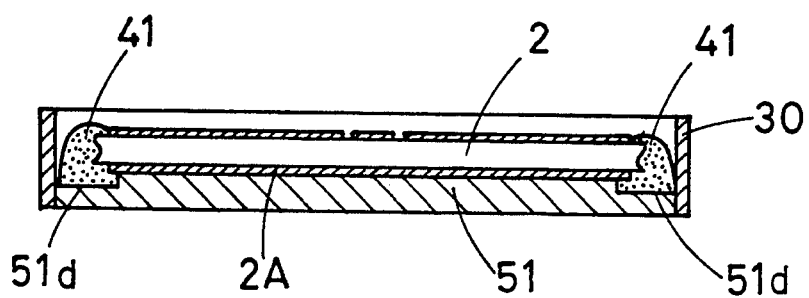
FIG. 14 is a view showing an anode electrode plate provided with a stepped portion on its periphery.

While the anode electrode plate 51 is provided with the ring-shaped groove 51a in the embodiment of FIG. 4 in order to fix the semiconductor element 2 to the anode electrode plate 51, the shape of the anode electrode plate 51 is not necessary restricted to that of a groove but a stepped portion 51d may be formed in an outer peripheral portion of a anode electrode plate 51 as shown in FIG. 14. In the embodiment of FIG. 14, an adhesive holding member 41 may outwardly flow if the same is prepared from a material having high fluidity. Therefore, the anode electrode plate 51 may be engaged with a ring-shaped weir member 30 which is formed by a material hardly solidifying a bonding agent. Thereafter, the adhesive holding member 41 is charged in the stepped portion 51d, and then the weir member 30 is removed after the adhesive holding member 41 is solidified.

Figure 11:
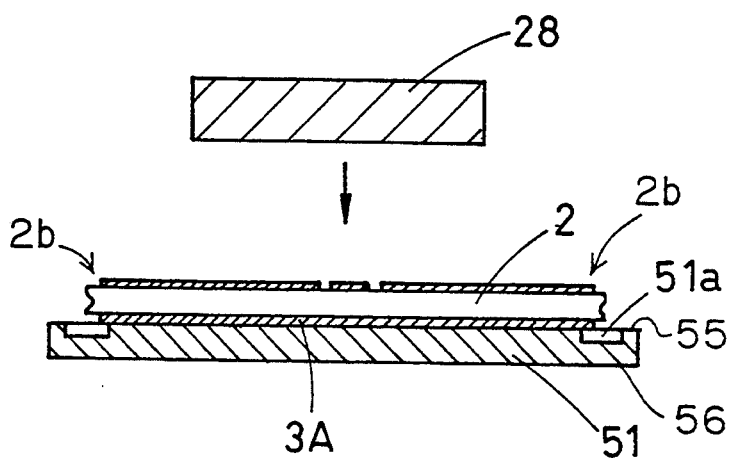
FIGS. 11 to 13 are views showing a procedure of fixing a semiconductor substrate to the anode electrode plate.

In the fixing method shown in FIGS. 11-13, further, the adhesive holding member 41 may pour in the clearance between the anode metallization layer 3A and the anode electrode plate 51 by a capillary phenomenon, to be solidified there. In this case, electrical bonding between the anode metallization layer 3A and the anode electrode plate 51 may be made defective. When the inflow adhesive holding member 41 forms a thick film, further, a hollow portion may be so formed in the interior that the central portion of the semiconductor element 2 may be deflected and broken at the worst when pressures are applied from the exterior of the external electrodes 10A and 10K.

Figure 15:
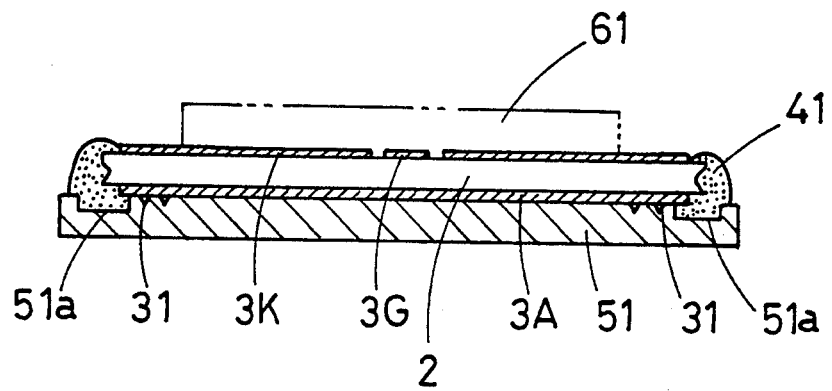
FIG. 15 is a view of an anode electrode plate provided with auxiliary grooves.

Such a situation can be solved by means that auxiliary grooves 31 are provided in positions close to the inner periphery wall 51c of the ring-shaped groove 51a of the anode electrode plate 51 along the ring-shaped groove 51a, as shown in FIG. 15.

Even if the adhesive holding member 41 flows into the clearance between the semiconductor element 2 and the anode electrode plate 51, such inflow is blocked at the portions of the auxiliary grooves 31 not to further flow into the interior, thereby causing none of the aforementioned problem.

Figure 1:
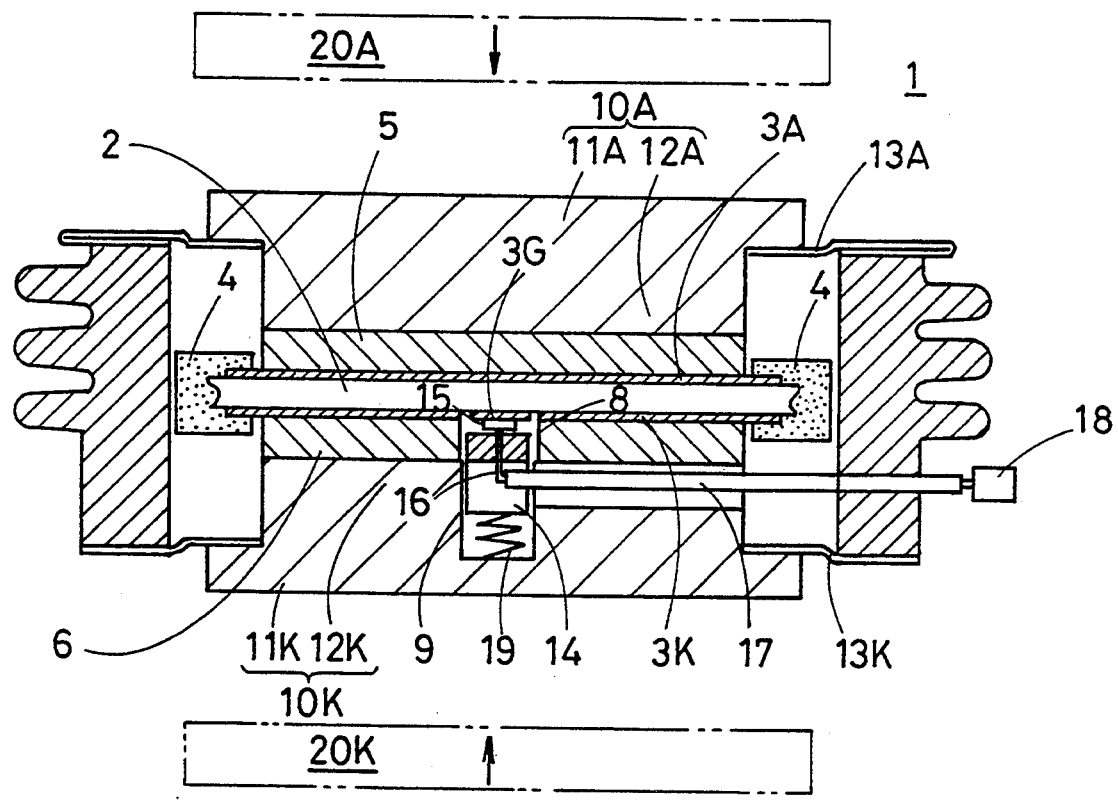
FIG. 1 is a longitudinal sectional view of a conventional pressure contact type semiconductor device.
Figure 2:
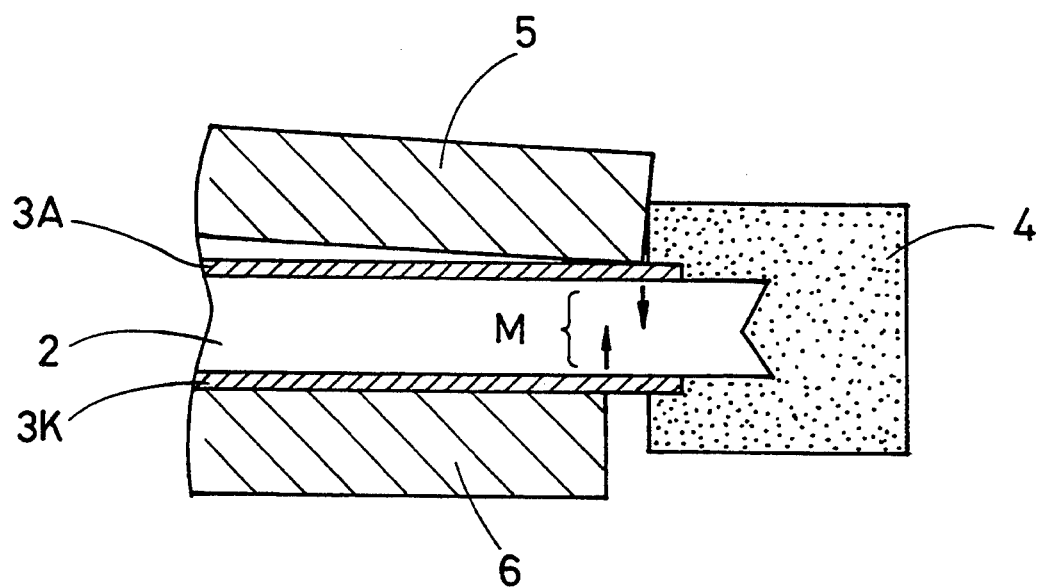
FIG. 2 is an enlarged sectional view of the semiconductor device of FIG. 1.
Figure 3:
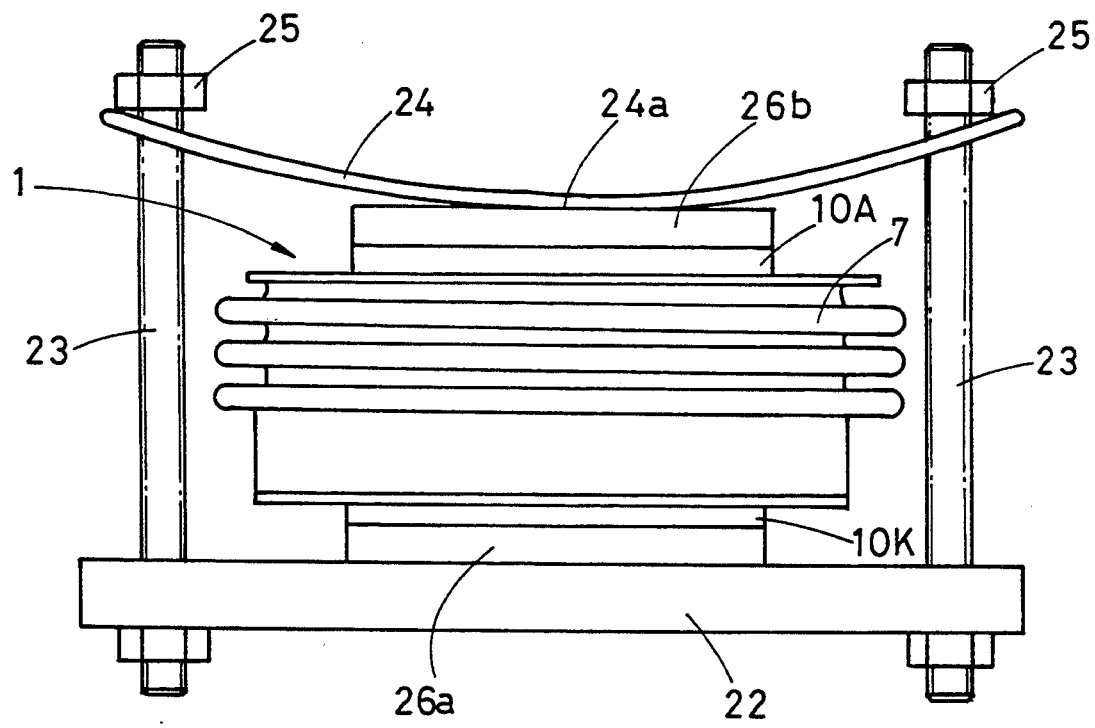
FIG. 3 illustrates a holder for carrying the conventional semiconductor device.

In this case, the ring-shaped auxiliary grooves 31 may not be so increased in depth, while the positions of provision thereof are preferably set outwardly beyond the outer peripheral edge of the cathode electrode plate 61 so that no couple moment as shown in FIG. 2 is caused to break the semiconductor element 2 in these portions.

While the number of the ring-shaped auxiliary grooves 31 is not restricted to two as shown in FIG. 15, a number of about two is preferable since it may be impossible to completely block inflow of the adhesive holding member 41 with only one auxiliary groove, while areas of electrical contact with the anode metallization layer are reduced if the number is too large. Further, the sectional shapes of the auxiliary grooves are not restricted to the triangular ones shown in the figure but can be modified at need.

Figure 16:
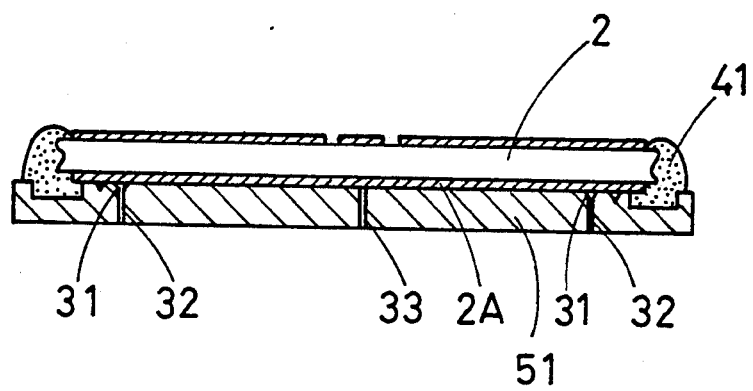
FIG. 16 is a view showing an anode electrode plate provided with air vent holes.

When the semiconductor element 2 is placed on and fixed to the anode electrode plate 51, further, air may be sealed in the clearance between the semiconductor element 2 and the anode electrode plate 51 or a gas may be generated in the interior by heating for solidification depending on the type of the adhesive holding member 41, and electrical bonding between the semiconductor element 2 and the anode electrode plate 51 is made defective in such a case. Therefore, an air vent hole 32 passing through the anode electrode plate 51 and communicating with the auxiliary grooves 31 and a similar air vent hole 33 provided in the central portion of the anode electrode plate 51 may be formed as shown in FIG. 16.

Although the semiconductor element 2 is fixed to the anode electrode plate 51 in each of the aforementioned embodiments, an outer peripheral edge of a second electrode plate 62 may be projected outwardly beyond that of a semiconductor element 2 as in a semiconductor device 102 shown in FIG. 12 to form a ring-shaped groove 62a, so that an adhesive holding member 41 is charged in this portion in the method as shown in FIGS. 11-13 to fix the semiconductor element 2.

Figure 17:
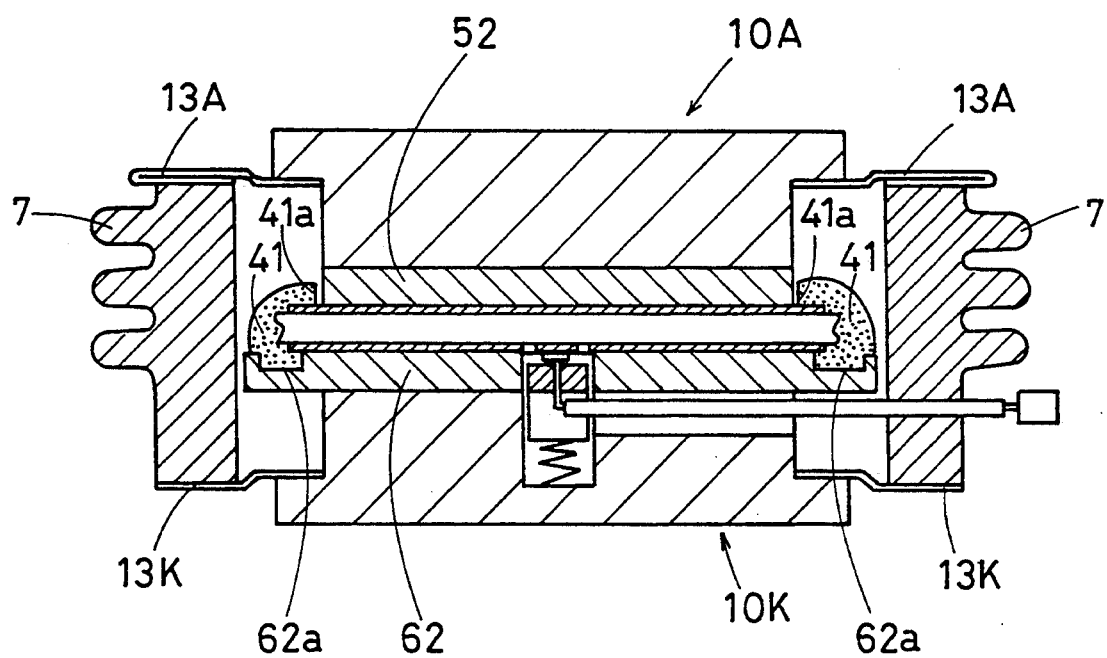
FIG. 17 is a longitudinal section of a semiconductor device according to a further another embodiment of the present invention.

In this case, an inner peripheral surface 41a of the adhesive holding member 41 serves as a stopper so that a first electrode plate 52 is not displaced in FIG. 17. Such a shape of the inner peripheral surface 41a can be easily achieved by placing a weir ring having an outer peripheral surface of the same diameter as the inner peripheral surface 41a on the semiconductor element 2 in charging of the adhesive holding member 41, for example.

Figure 18:
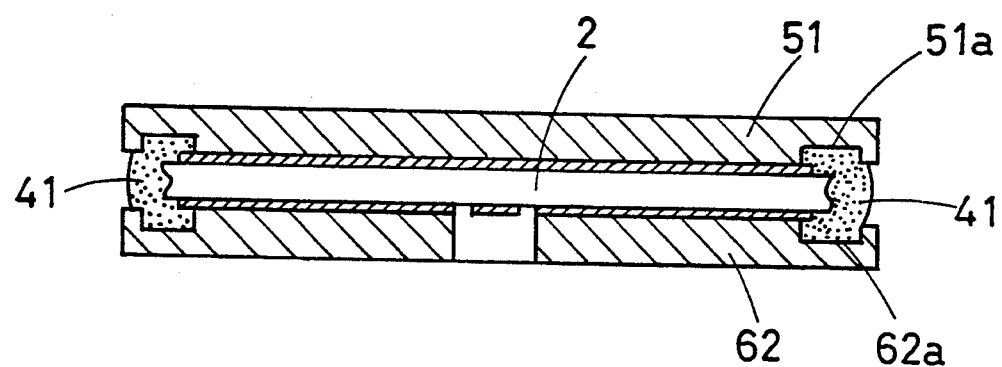
FIG. 18 is a view showing a state of fixing a semiconductor substrate to both of anode and cathode electrode plates.

Alternatively, anode and cathode electrode plates 51 and 62 of the same shapes may be prepared so that an adhesive holding member 41 is charged in a space defined by ring-shaped grooves 51a and 62a in a state holding a semiconductor element 2 by the electrode plates 51 and 62, thereby fixing the semiconductor element 2 to the both electrode plates 51 and 62, as shown in FIG. 18.

While each of the above embodiments has been described with reference to a semiconductor device (thyristor) provided with a center gate, the present invention is not restricted to such a semiconductor device alone but is also applicable to general pressure contact type high capacity semiconductor devices such as a pressure contact type diode, a transistor, a GTO and the like.

In the semiconductor device according to the first embodiment of the present invention, as hereinabove described, at least one of the first and second electrode plates (anode and cathode electrode plates) is employed as a fixing electrode plate so that its outer peripheral edge outwardly projects beyond that of the semiconductor element while its one major surface is provided with a stepped portion having a surface retracted from the major surface along the outer peripheral edge of the semiconductor element in a prescribed width including a projected portion of the outer peripheral edge and the adhesive holding member is charged in the stepped portion and the outer peripheral portion of the semiconductor element to fix the semiconductor element to the fixing electrode plate, whereby the adhesive holding member is firmly engaged with the stepped portion to be hardly separated and front and back sides of the outer peripheral portion of the semiconductor element including the end portion are covered with the adhesive holding member and sufficiently protected to be reliably fixed to the first electrode plate.

Consequently, the semiconductor element can stably serve its function while the fixing electrode plate serves as a reinforcing plate, whereby there is no apprehension for breakage even if an impact is applied during carriage of the semiconductor device or mounting on an applied apparatus.

Thus, no troublesome operation is required for holding such semiconductor devices 1 one by one in carrier pressure holders for carriage and a transportation space can be remarkably reduced, while mass transportation is enabled and there is no apprehension for breakage in mounting on applied apparatuses.

According to the inventive method of assembling a semiconductor device, further, it is possible to properly assemble a semiconductor device having the aforementioned structure.

B. Second Embodiment

In the semiconductor device 100, a voltage applied across the cathode metallization layer 3K and the anode electrode plate 51 coincides with that applied to the semiconductor device 100. Thus, the withstand voltage of the semiconductor device 100 is depended upon a on-the-surface distance of adhesive holding member 41. The term "on-the-surface distance" indicates a distance coupling upper and lower sides of the semiconductor element 2 along the surface of the adhesive holding member 41c, such as that of a path along points PA, PB and PC in FIG. 19, for example. As the on-the-surface distance is increased, the electric distance between the upper and lower major surfaces of the semiconductor element 2 is increased to hardly cause a phenomenon such as shorting. In order to increase the on-the-surface distance of the adhesive holding member 41, therefore, the amount of application of the adhesive holding member 41 may be increased.

Figure 19:
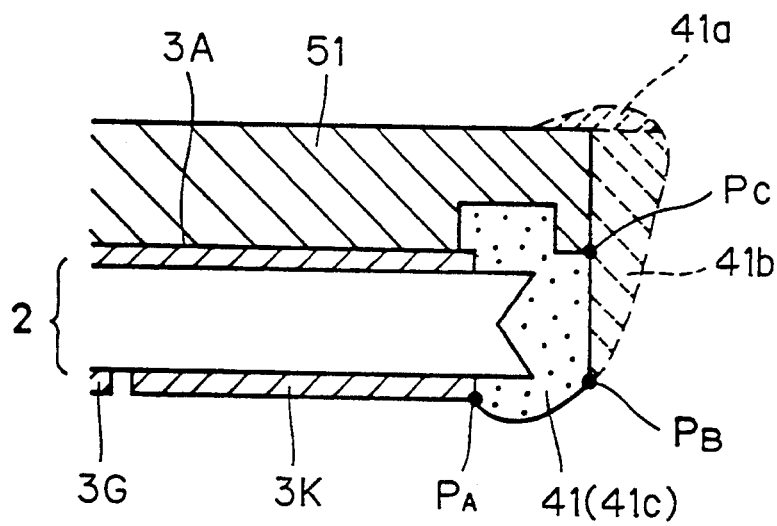
FIGS. 19 and 20 are partially enlarged views of the semiconductor device according to the first embodiment.
Figure 20:
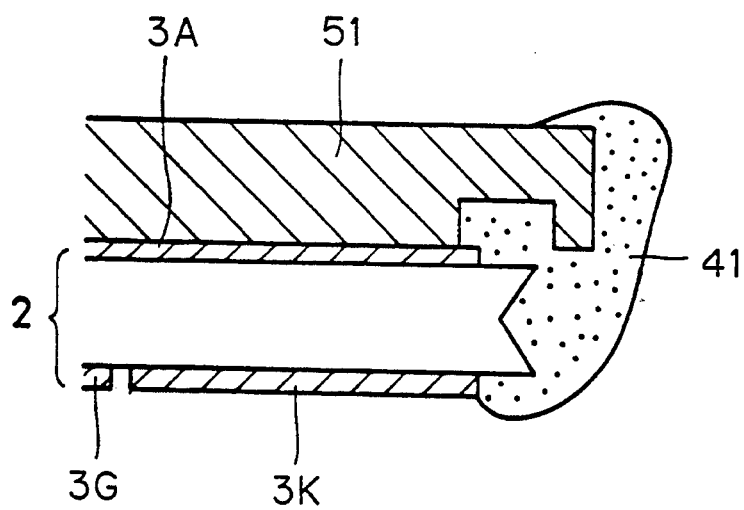

In this case, the adhesive holding member 41 may reach an outer peripheral side surface and an upper surface of the anode electrode plate 51 as shown in FIG. 20, for example, and it is necessary to remove such excessive portions of the adhesive holding member 41, in order to engage the semiconductor element 2 in the casing 7. To this end, there have been proposed two forming methods in general: The first method is adapted to apply the adhesive holding member 41 to cover the outer peripheral portions of the semiconductor element 2 and the anode electrode plate 51, solidify the same and thereafter mechanically removing excessive portions 41a and 41b of the adhesive holding member 41 for forming the adhesive holding member 41c of a desired shape, as shown in FIG. 19; On the other hand, the second method is adapted to previously arrange a molding jig along the outer configuration of the anode electrode plate 51, apply the adhesive holding member 41 to a space portion defined by this molding jig, the semiconductor element 2 and the anode electrode plate 51, solidifying the same and thereafter removing the molding jig.

Whichever method is employed, however, the electrical characteristic of the semiconductor device is so instabilized by contamination from a jig for removing the portions 41a and 41b or from a molding apparatus that reliability of the semiconductor device is reduced. When a machine tool such as a lathe is employed in order to remove the portions 41a and 41b, for example, oil, ionic substances (Na ions forming salinity contained in water) and the like are mixed into the adhesive holding member 41 to block its insulativity and the like. Further, the fabrication steps are increased in addition to the problem of reduction in reliability of the semiconductor device.

When difference in outside dimension between the semiconductor element 2 and the anode electrode plate 51 is reduced, farther, bond strength between the same is reduced since the semiconductor element 2 bonded to the anode electrode plate 51 by the adhesive holding member 41. Particularly when the semiconductor element 2 is provided with a planar type semiconductor device (a type having a P-N junction exposed on a major surface of the semiconductor element), a field relieving region such as a guard ring is generally provided in an outer peripheral portion of a cathode region in order to attain a high withstand voltage, and hence it is necessary to increase the semiconductor element 2 in outer size as compared with that provided with a mesa type semiconductor element exposing a P-N junction on the outer peripheral side surface of the semiconductor element 2. Consequently, the difference in outside dimension between the semiconductor element 2 and the anode electrode plate 51 is farther reduced to cause a remarkable problem of reduction in bond strength.

It will be now described the preferred embodiment to solve the aforementioned problems.

Figure 21:
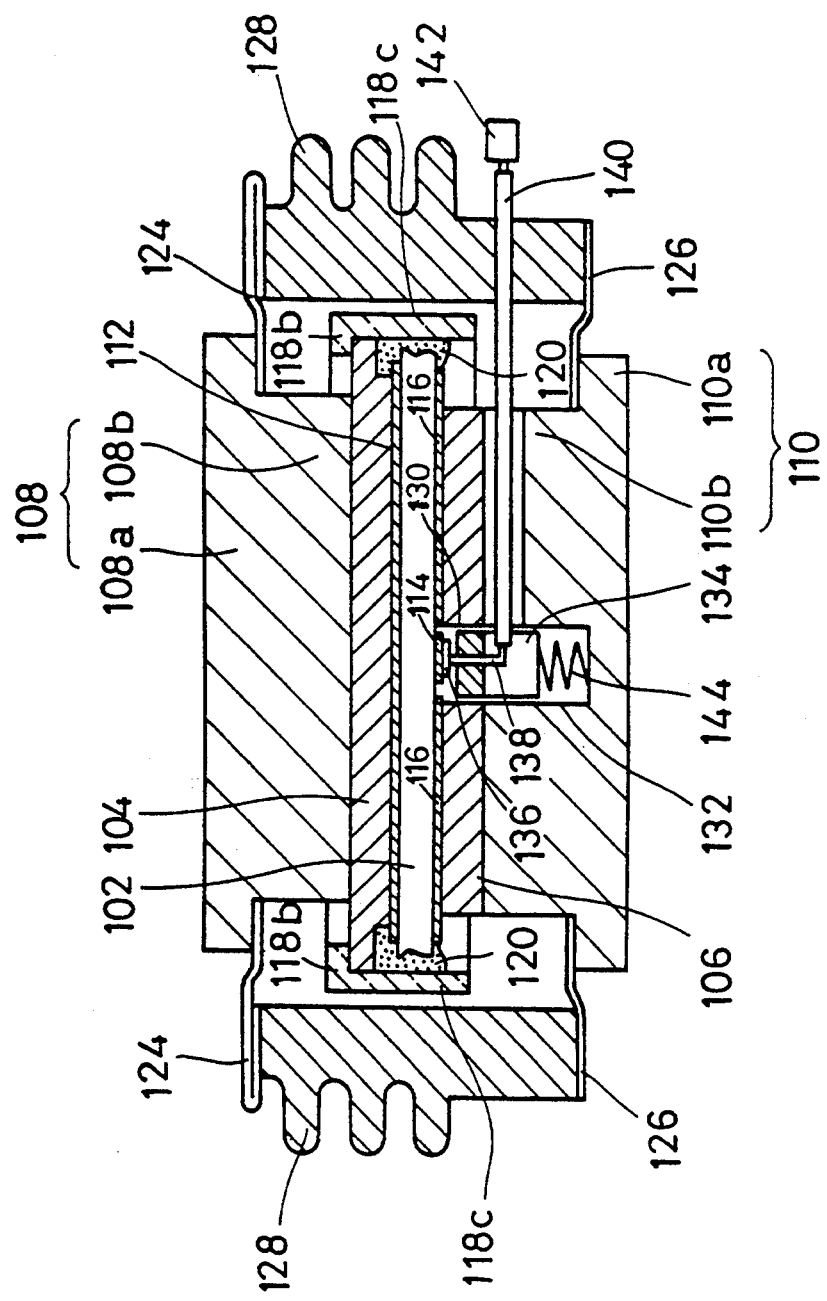
FIG. 21 is a longitudinal sectional view of a second embodiment of the semiconductor device according to the present invention.

FIG. 21 is a longitudinal sectional view of a second embodiment of a semiconductor device according to the present invention. As shown in FIG. 21, this pressure contact type semiconductor device has a semiconductor element 102, an anode electrode plate 104, a cathode electrode plate 106, an external anode electrode 108 and an external cathode electrode 110, so that the semiconductor element 102 is held through the external anode electrode 108 and the external cathode electrode 110 under pressure from an external apparatus when this device is assembled in the external apparatus.

Figure 22:
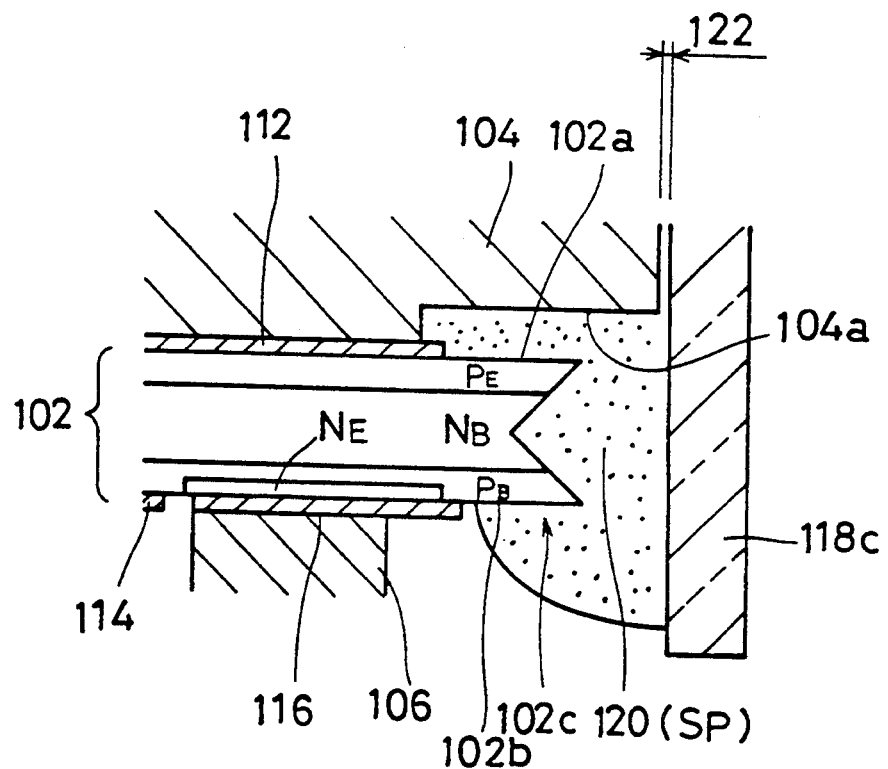
FIG. 22 is a partially enlarged view of the semiconductor device shown in FIG. 21.

This semiconductor element 102 is formed by a silicon substrate, for example, and provided with at least one P-N junction. For example, the semiconductor element 102 is provided with a mesa type thyristor, as shown in FIG. 22. Namely, a P-emitter layer PE and a P-base layer PB are formed on upper and lower major surface 102a and 102b of the semiconductor element 102, respectively, while an N-base layer NB is formed between the P-emitter layer PE and the P-base layer PB. Further, an N-emitter layer NE is provided in a part of the P-base layer PB. In this mesa type thyristor, the P-N junction is exposed on a side surface of an outer peripheral portion 102c of the semiconductor element 102 as shown in FIG. 22, and hence it is particularly important to prevent the side surface from contamination.

Further, a metal such as aluminum is vapor-deposited on a part of an upper major surface 102a of the semiconductor element 102, to define an anode metallization layer 112 which serves as an anode electrode. On the other hand, a gate metallization layer 114 for serving as a gate electrode and a cathode metallization layer 116 for serving as a cathode electrode are formed on a central portion of a lower major surface 102b and a peripheral region thereof respectively in a similar manner to the anode metallization layer 112.

The anode electrode plate 104 is provided substantially in the form of a disc having a diameter which is larger than the semiconductor element 102 and smaller than an inner diameter of a cylindrical casing 128 which is made of ceramic. Further, the anode electrode plate 104 is formed in its lower major surface with a ring-shaped stepped portion 104a (FIG. 22) which is concentric with its outer periphery.

Figure 23:
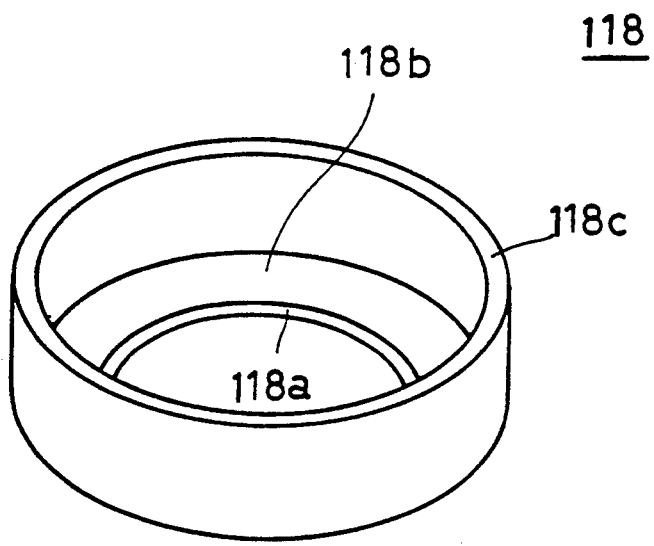
FIG. 23 is a perspective view of an exemplary cylindrical insulating member.
Figure 24:
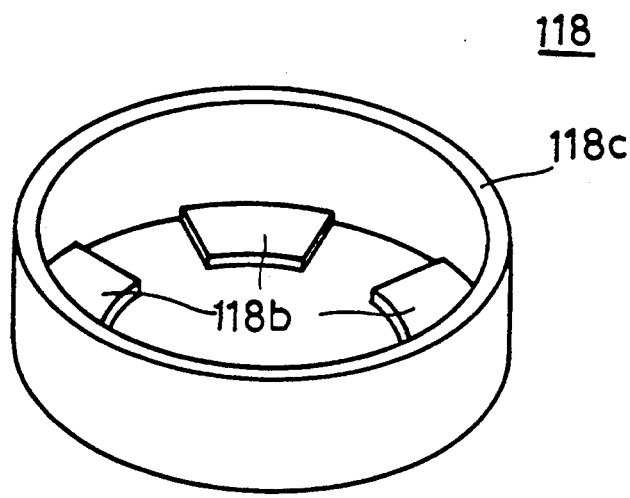
FIG. 24 is a perspective view of another exemplary cylindrical insulating member.

Engaged in this anode electrode plate 104 is a substantially cylindrical heat-resistant insulating member (hereinafter referred to as "cylindrical insulating member") 118, which is preferably made of ceramic. FIG. 23 is a perspective view of the cylindrical insulating member 118. As shown in FIG. 23, a stop portion 118b is inwardly projected from one end side of a side surface portion 118c of this cylindrical insulating member 118. When the anode electrode plate 104 is engaged from another end side of the cylindrical insulating member 118, therefore, the stop portion 118b is engaged with the upper major surface of the anode electrode plate 104 to locate the same (FIG. 21). The configuration and the number of the stop portion 118b are not restricted to those shown in FIG. 23, but the same may alternatively be formed by a plurality of substantially trapezoidal stop portions 118b as shown in FIG. 24, for example. Further, the cylindrical insulating member 118 may alternatively be made of mica or formed by a polyimide compact.

The anode electrode plate 104 is so engaged in the cylindrical insulating member 118 as to define a space portion SP which is enclosed with a side surface portion 118c of the cylindrical insulating member 118, the outer peripheral portion 102c of the semiconductor element 102 and the stepped portion 104a of the anode electrode plate 104, and this space portion SP is filled up with adhesive holding member 120 such as a silicon rubber, a varnish-based material or the like. Therefore, the semiconductor element 102 is bonded not only to the anode electrode plate 104 but also to the cylindrical insulating member 118 by the adhesive holding member 120. Further, a small clearance 122 is defined between the anode electrode plate 104 and the cylindrical insulating member 118, and is filled up with the adhesive holding member 120, resulting in bonding the anode electrode plate 104 and the cylindrical insulating member 118 with each other. As the result, the outer peripheral portion 102c of the semiconductor element 102 is protected by the adhesive holding member 120 while the semiconductor element 102 is fixed to the anode electrode plate 104 in sufficient bond strength.

As shown in FIG. 21, a convex portion 108b of the external anode electrode 108 is inserted in a through hole 118a of the cylindrical insulating member 118, to be brought into contact with the upper major surface of the anode electrode plate 104.

On the other hand, the cathode electrode plate 106 is provided in its central portion with a through hole 130 while the external cathode electrode 110 is also provided with a cavity 132 having the same sectional shape as the through hole 130 in correspondence thereto, so that a gate electrode holder 134 is slidably engaged in an engaging hole which is defined by the cavity 132 and the through hole 130.

An internal gate electrode 136 is connected with an end of a lead wire 138, another end of which passes through a head portion of the gate electrode holder 134 and is drawn out to the exterior of the casing 128 through an insulating tube 140 provided through the casing 128, to be welded to an external gate electrode 142.

The gate electrode holder 134 formed by an insulating member is provided into the engaging hole which is defined by the cavity 132 and the through hole 130 so as to be upwardly urged. Consequently, the internal gate electrode 136 is firmly pressed against and electrically connected with the gate metallization layer 114.

Further, the gate electrode holder 134, which is engaged in the engaging hole, serves as the so-called stake to locate the cathode electrode plate 106 not to be displaced from a prescribed position of the external cathode electrode 110.

Figure 25:
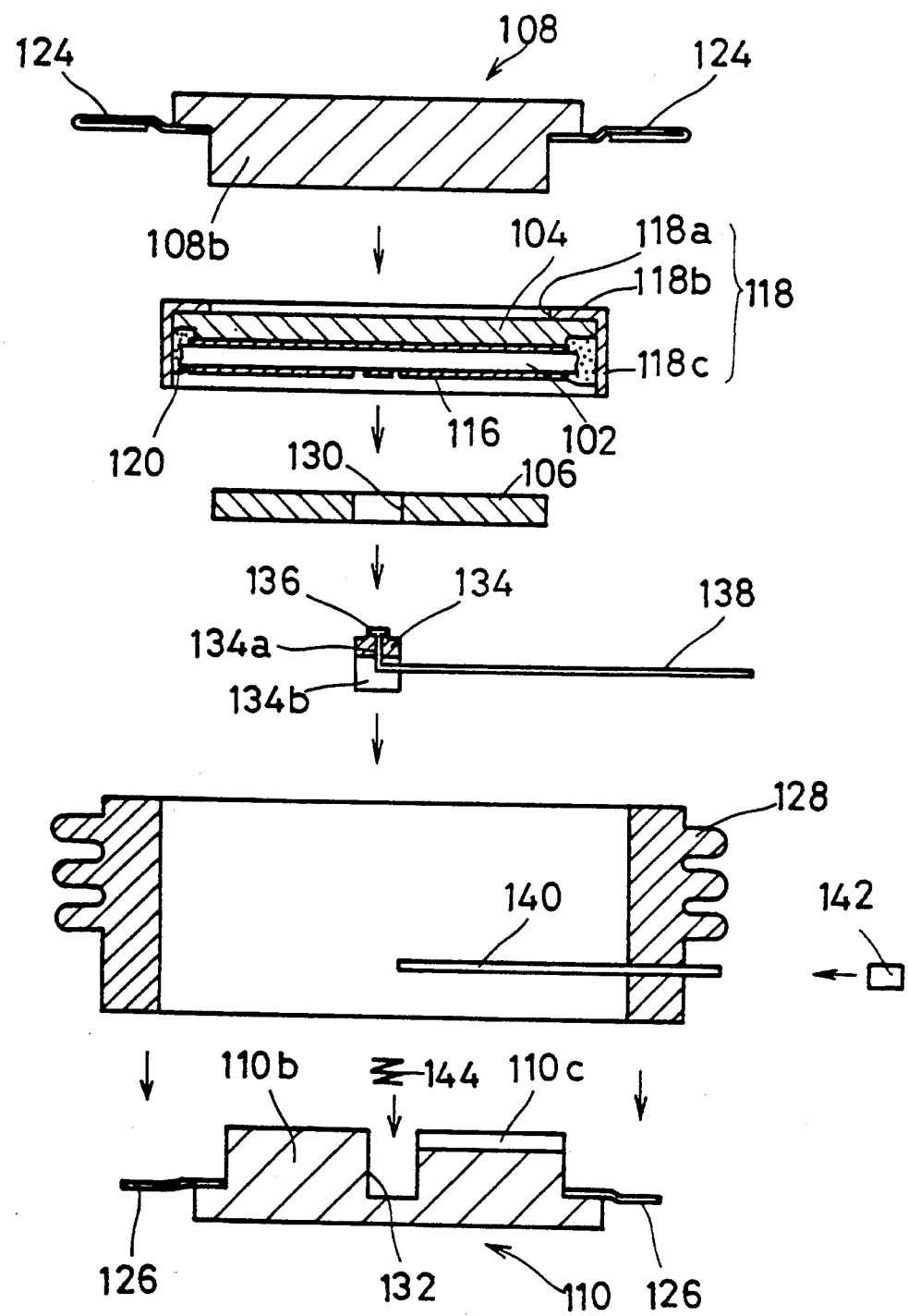
FIG. 25 is an exploded assembly diagram of the semiconductor device shown in FIG. 21.
Figure 26:
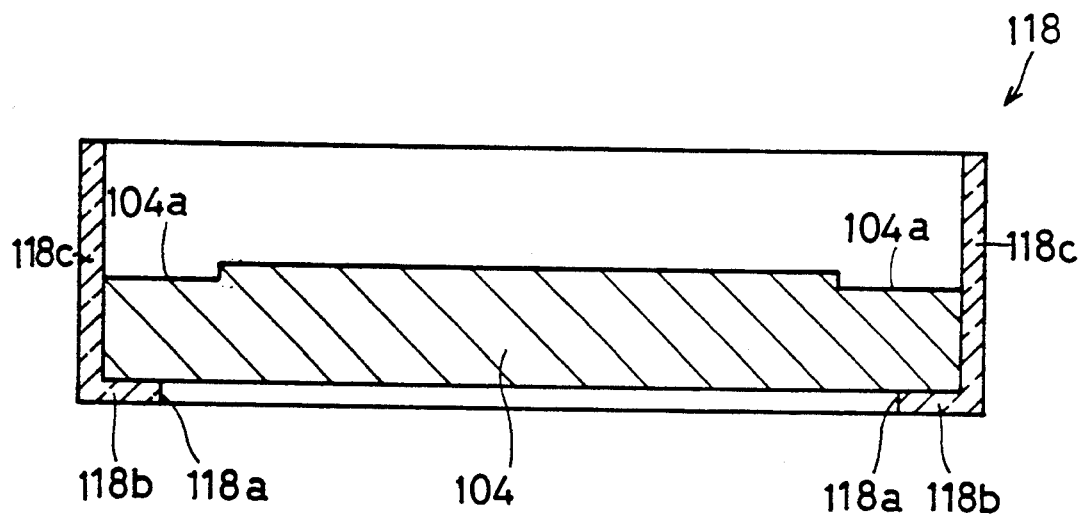
FIGS. 26 to 29 are diagrams showing a procedure of fixing a semiconductor substrate to an anode electrode plate.

The procedure of assembling the semiconductor device shown in FIG. 21 is now described with reference to an exploded assembly diagram shown in FIG. 25.

(1) First prepared is a casing 128 having an insulating tube 140 horizontally passing through a prescribed position of a cylindrical portion.

(2) An external cathode electrode 110 having a ring-shaped flange 126 which is fixed to its periphery is so placed as to upwardly direct its convex portion 110b, and a spring 144 is inserted in a cavity 132 which is formed at the center.

(3) The casing 128 is so placed on the flange 126 that its insulating tube 140 is located in a groove 110c which is formed in an upper surface of the external cathode electrode 110.

(4) A gate electrode holder 134 having an internal gate electrode 136 which is mounted on its head portion is engaged in an engaging hole 130 of the external cathode electrode 110. At this time, a lead wire 138 which is connected with the internal gate electrode 136 is passed through the insulating tube 140.

The internal gate electrode 136 is mounted by inserting a second end of the lead wire 138 whose first end is connected with the internal gate electrode 136 in a hole 134a axially passing through the gate electrode holder 134 and drawing out the same from a notch 134b which is formed in a lower portion of the gate electrode holder 134.

(5) The cathode electrode plate 106 is so placed on the external cathode electrode 110 that the head portion of the gate electrode holder 134 is engaged in the through hole 130 which is formed in its center.

(6) Then, the semiconductor element 102 which is fixed to the anode electrode plate 104 and the cylindrical insulating member 118 is inserted in the casing 128 while downwardly directing its cathode metallization layer 116, and placed on the upper surface of the cathode electrode plate 106. Thus, the semiconductor element 102 is previously fixed to the anode electrode plate 104, by a fixing method described with reference to FIGS. 26 to 29.

First, the cylindrical insulating member 118 is placed on a prescribed position to downwardly direct its stop portion 118b. Then, the anode electrode plate 104 is engaged in the cylindrical insulating member 118 to upwardly direct the stepped portion 104a.

Figure 27:
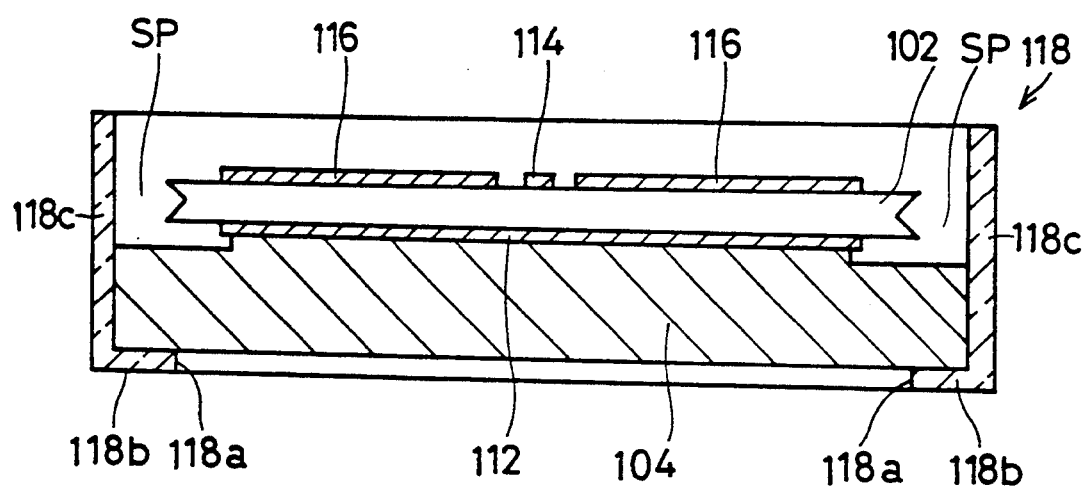

Then, the semiconductor element 102 is so placed on the anode electrode plate 104 that the anode metallization layer 112 is in contact with the anode electrode plate 104 (FIG. 27). Thus, a space portion SP is defined by a side surface portion 118c of the cylindrical insulating member 118, the semiconductor element 102 and the stepped portion 104a of the anode electrode plate 104.

Figure 28:
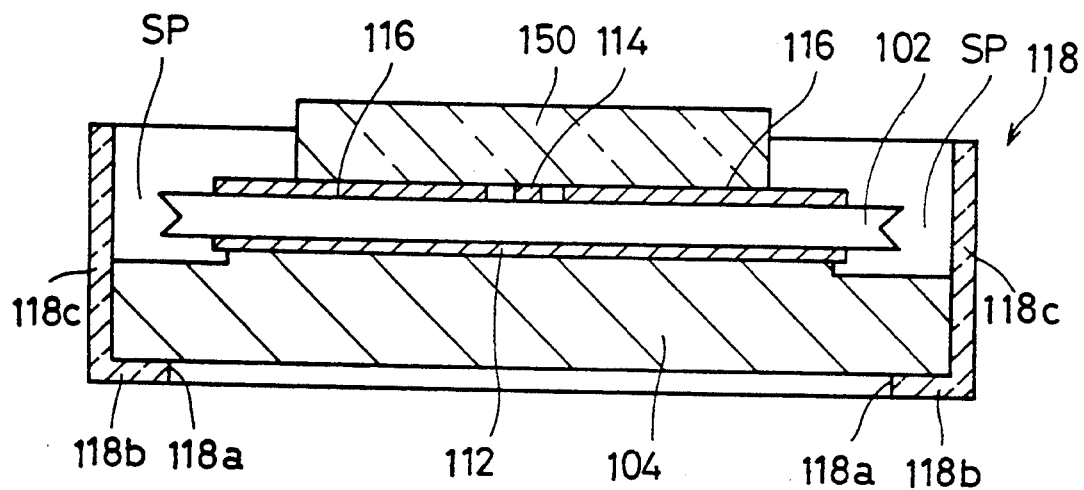
Figure 29:
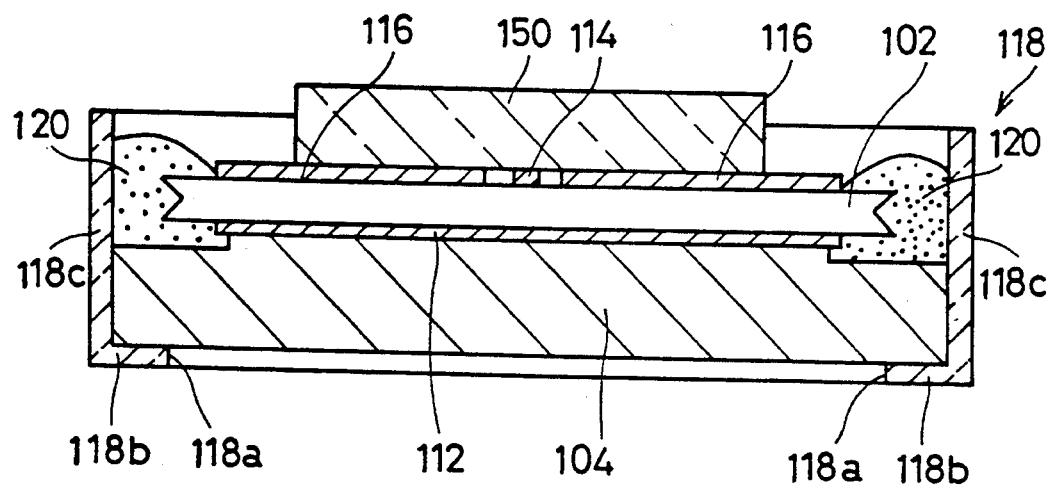

Then, a weight 150 for preventing displacement is placed on the semiconductor element 102 (FIG. 28). Thereafter adhesive holding member is filled up in the space portion SP, and the semiconductor element 102 is heated at a prescribed temperature for a constant time in a state receiving the weight 128, thereby solidifying the adhesive holding member 120 (FIG. 29).

Thus, according to this embodiment, the space portion SP is defined by the cylindrical insulating member 118, the semiconductor element 102 and the anode electrode plate 104 so that the space portion SP is filled up with the adhesive holding member 120, thereby preventing such a situation that excessive part of the adhesive holding member 120 flows out in application thereof. Thus, no operation is required for removing an excessive part after solidification of the adhesive holding member 120. Further, no jig is required for molding the adhesive holding member 120. As the result, it is possible to prevent the semiconductor device from instabilization of the withstand voltage resulting from contamination of the adhesive holding member 120, whereby reliability of the semiconductor device can be improved.

Further, the fabrication steps can be simplified for such a reason that no operation for removing the silicon rubber is required.

In addition, insulators which are present between the anode metallization layer 112 and the cathode metallization layer 116 are defined by the adhesive holding member 120 and the side surface portion 118c of the cylindrical insulating member 118, whereby the on-the-surface distance between the anode metallization layer 112 and the cathode metallization layer 116 is so lengthened that the withstand voltage of the semiconductor device can be improved.

Further, the adhesive holding member 120 which is employed as an insulating bonding member has constant elasticity even if the same is solidified, to serve as an excellent protective member for an end portion of the semiconductor element 102.

(7) The description is returned to illustration of the method of assembling the semiconductor device. The external anode electrode 108 is inserted in the casing 128 from above the anode electrode plate 104 while downwardly directing the convex portion 108b, and the flange 124 is matched with an upper end portion of the casing 128.

(8) The flange 126 of the external cathode electrode 110 and the flange 124 of the external anode electrode 108 are fixed to the end surface of the casing 128 respectively by brazing.

(9) Finally, an external gate electrode 142 is welded and fixed to the end portion of the lead wire 138 which is exposed to the exterior through the insulating tube 140.

Thus, the semiconductor device shown in FIG. 21 is assembled.

MODIFICATIONS

Figure 30:
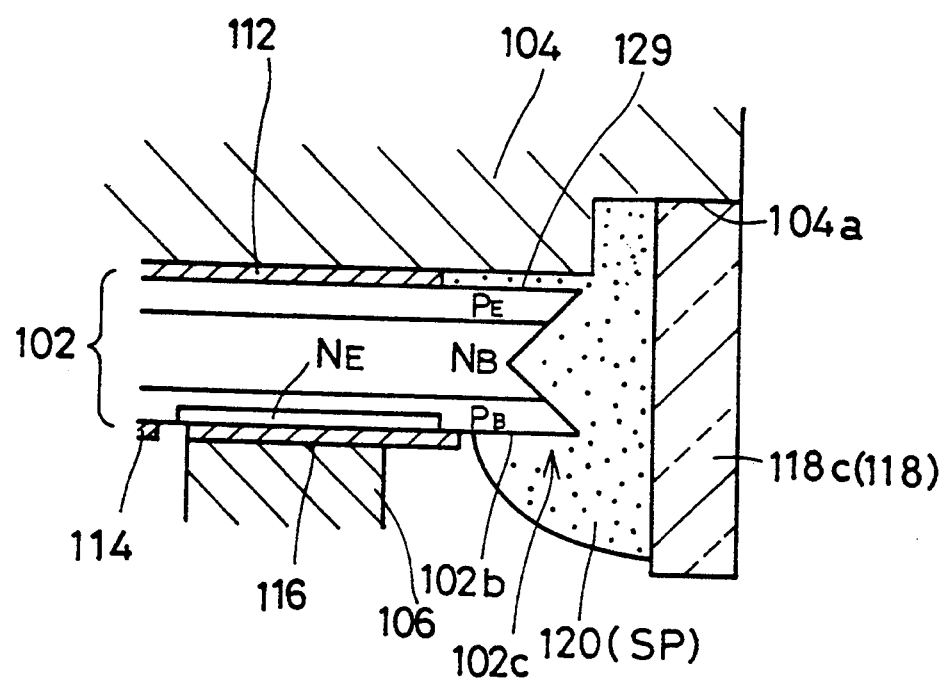
FIG. 30 is a partially enlarged view showing a first modification of the semiconductor device according to the second embodiment.

Although the stop portion 118b is provided on one end side of the cylindrical insulating member 118 in the aforementioned embodiment, this is not an essential element of this embodiment but a cylindrical insulating member 118 having no stop portion 118b may be employed as shown in FIG. 30, for example. In this case, however, it is necessary to form the cylindrical insulating member 118 so that an end of its side surface portion 118c is engaged with a stepped portion 104a of an anode electrode plate 104. Namely, a space portion SP may be cooperatively defined by a semiconductor element 102 and the anode electrode plate 104 in such a state that the cylindrical insulating member 118 is engaged with the anode electrode plate 104 (FIG. 30).

When the cylindrical insulating member 118 shown in FIG. 30 is employed, it is necessary to fix the semiconductor element 102 to the anode electrode plate 104 and the cylindrical insulating member 118 in a procedure different from the above. This procedure is now described with reference to FIGS. 31 to 34.

Figure 31:
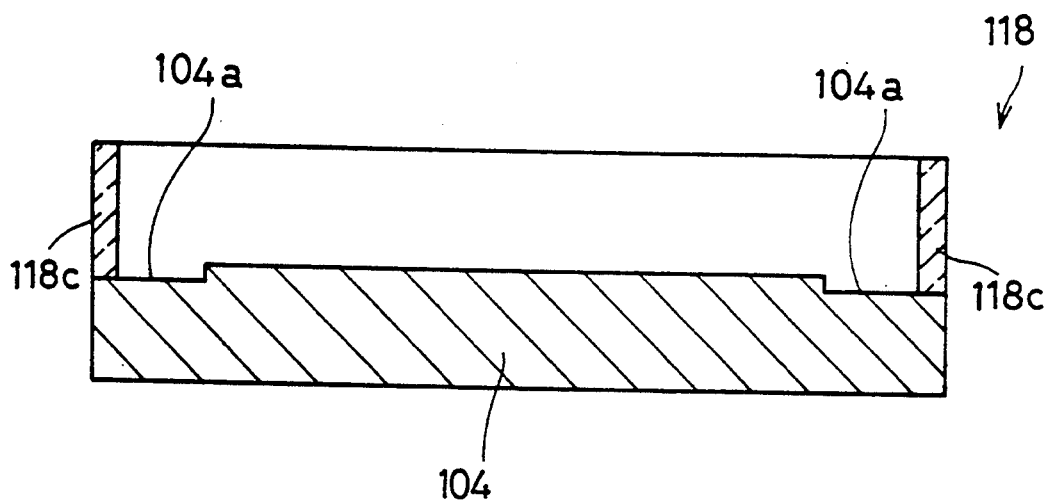
FIGS. 31 to 34 are views showing a procedure of fixing a semiconductor substrate to an anode electrode plate in the first modification.

First, the anode electrode plate 104 is placed on a prescribed position to upwardly direct the stepped portion 104a which is finished to be engageable with one end portion of the side surface portion 118c of the cylindrical insulating member 118, as shown in FIG. 31. Then, one end portion of the side surface portion 118c of the cylindrical insulating member 118 is engaged with the stepped portion 104a, so that the cylindrical insulating member 118 is positioned/placed on the anode electrode plate 104. While the cylindrical insulating member 118 and the anode electrode plate 104 are bonded to each other by adhesive holding member 120 as described later, the anode electrode plate 104 and the cylindrical insulating member 118 are preferably previously bonded to each other by a proper binder at this point of time.

Figure 32:
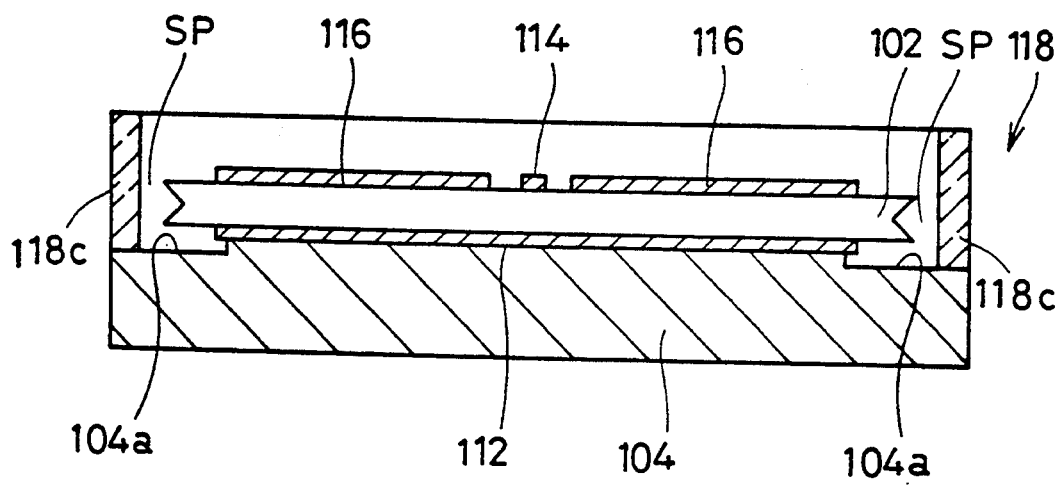
Figure 33:
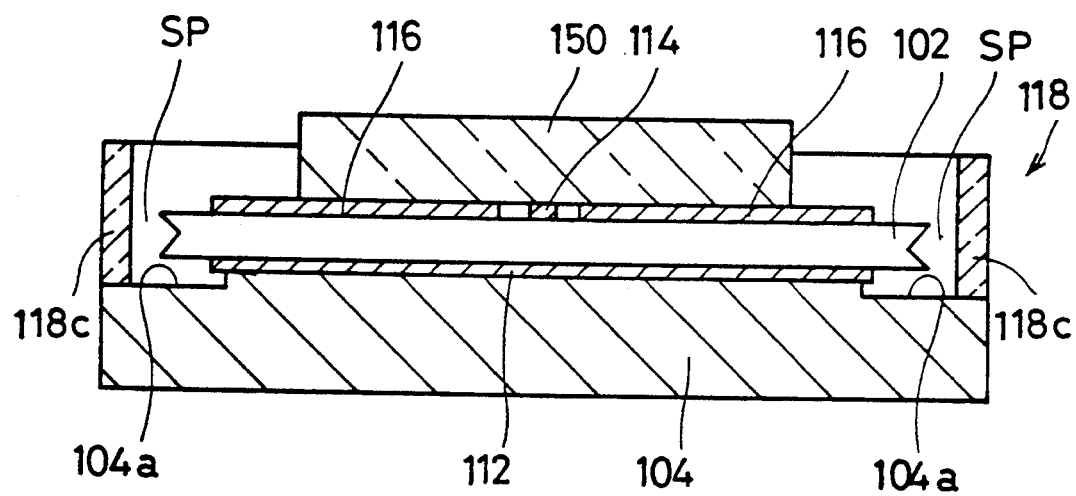
Figure 34:
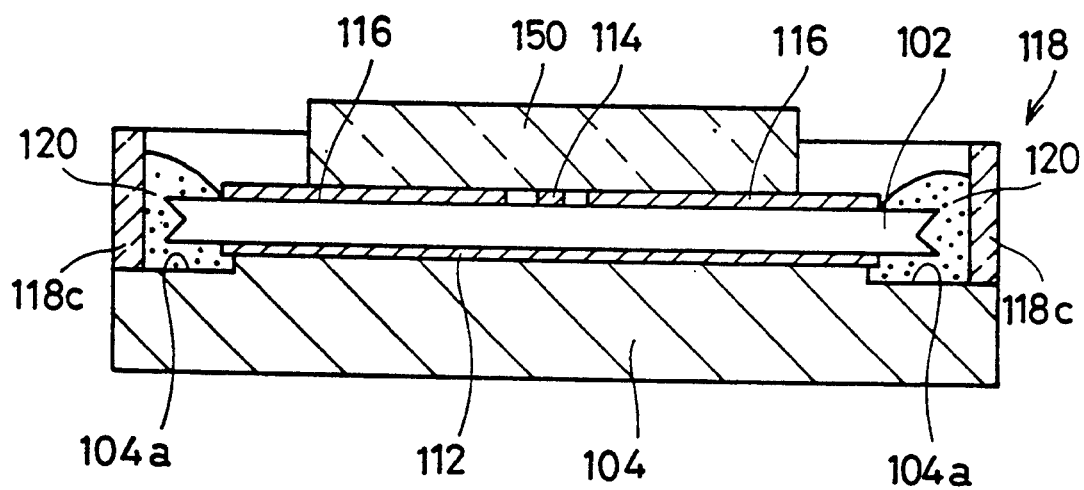

Then, a semiconductor element 102 is fixed in a similar manner to the above. Namely, the semiconductor element 102 is so placed on the anode electrode plate 104 that an anode metallization layer 112 is in contact with the anode electrode plate 104 (FIG. 32). Thereafter a weight 150 for preventing displacement is placed on the semiconductor element 102 (FIG. 33), the adhesive holding member 120 is filled up in a space SP defined by the side surface portion 118c of the cylindrical insulating member 118, the semiconductor element 102 and the stepped portion 104a of the anode electrode plate 104, and thereafter prescribed heat treatment is performed to solidify the adhesive holding member 120 (FIG. 34).

Figure 35:
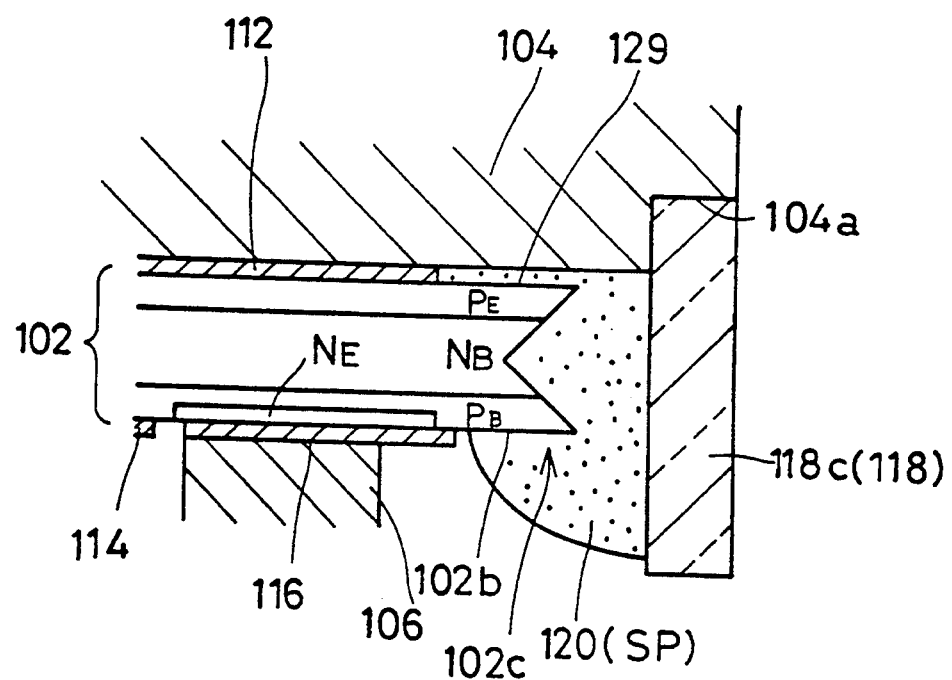
FIG. 35 is a partially enlarged view of a second modification of the semiconductor device according to the second embodiment.

The width of the stepped portion 104a of the anode electrode plate 104 may be made substantially identical to the thickness of the side surface portion 118c of the cylindrical insulating member 118 so that the cylindrical insulating member 118 is brought into contact with the anode electrode plate 104 in two portions, i.e., an upper end portion and the side surface portion 118c as shown in FIG. 35, so that bond strength is further increased in this case as compared with the bonding state shown in FIG. 30.

Figure 36:
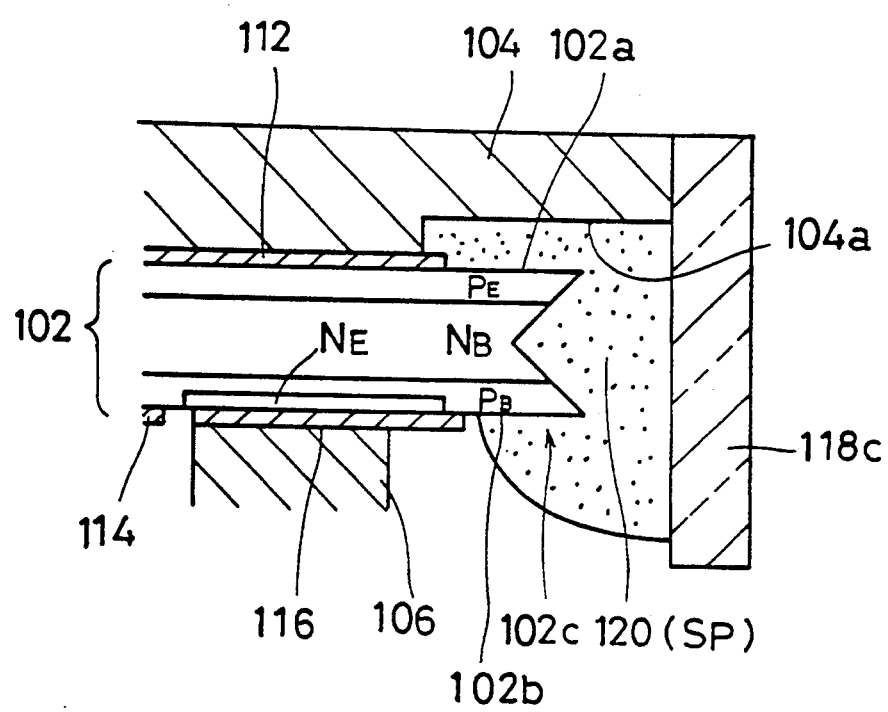
FIG. 36 is a partially enlarged view of a third modification of the semiconductor device according to the second embodiment.
Figure 37:
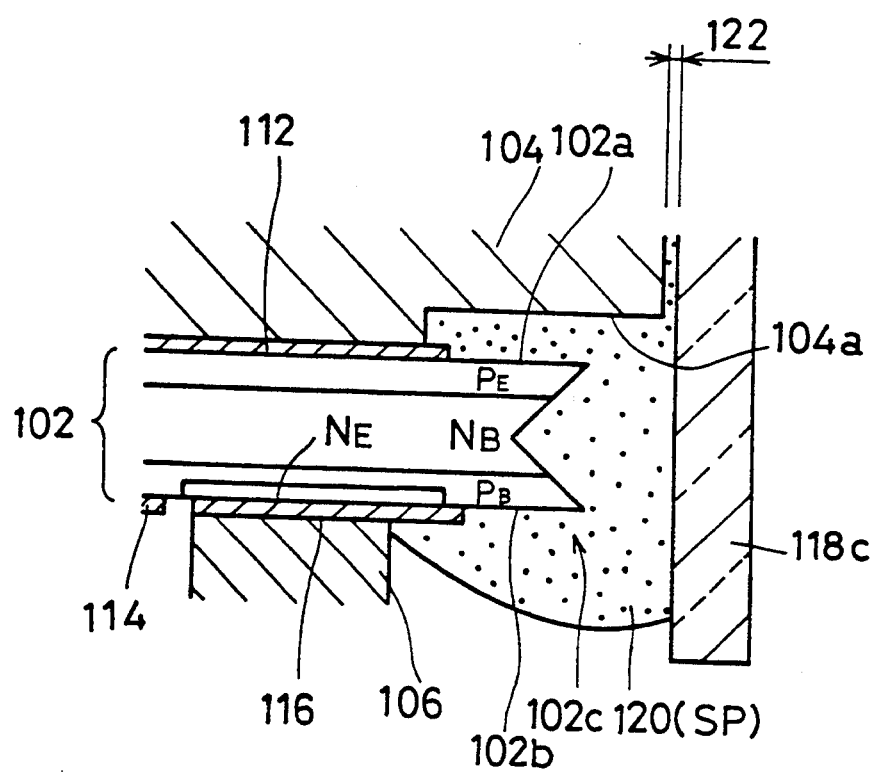
FIG. 37 is a partially enlarged view of a fourth modification of the semiconductor device according to the second embodiment.

Alternatively, the outer diameter of the anode electrode plate 104 may be substantially matched with the inner diameter of the cylindrical insulating member 118 as shown in FIG. 36, so that the outer diametral portion of the anode electrode plate 104 is bonded to the inner peripheral surface of the cylindrical insulating member 118.

Further, the adhesive holding member 120 may be so filled up in the space portion SP that the adhesive holding member 120 covers not only the cylindrical insulating member 118, the anode electrode plate 104 and the semiconductor element 102 but the cathode electrode plate 106. In this case, however, it is necessary to fix the semiconductor element 102 to the anode electrode plate 104, the cathode electrode plate 106 and the cylindrical insulating member 118 in a procedure different from the above. This procedure is now described with reference to FIGS. 38 to 40.

Figure 38:
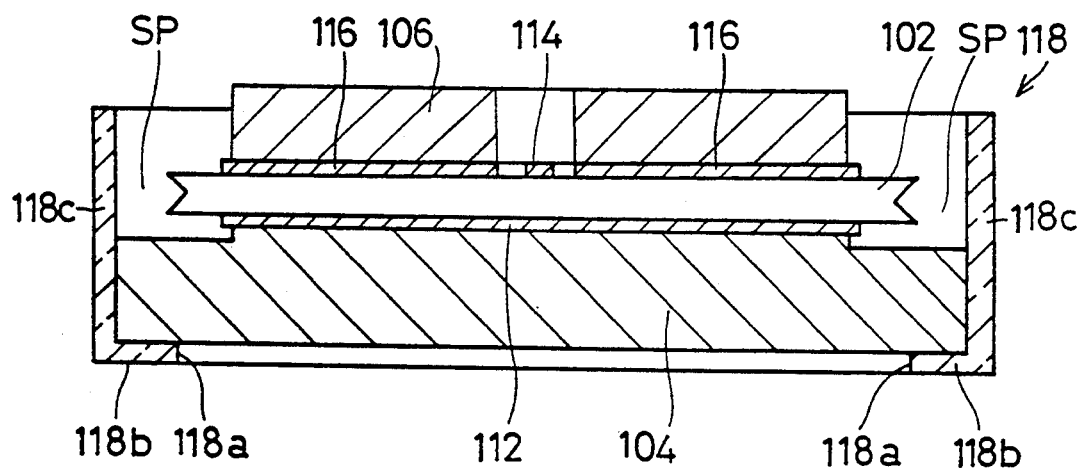
FIGS. 38 to 40 are views showing a procedure of fixing a semiconductor substrate to an anode electrode plate and a cathode electrode plate in the fourth modification.
Figure 39:
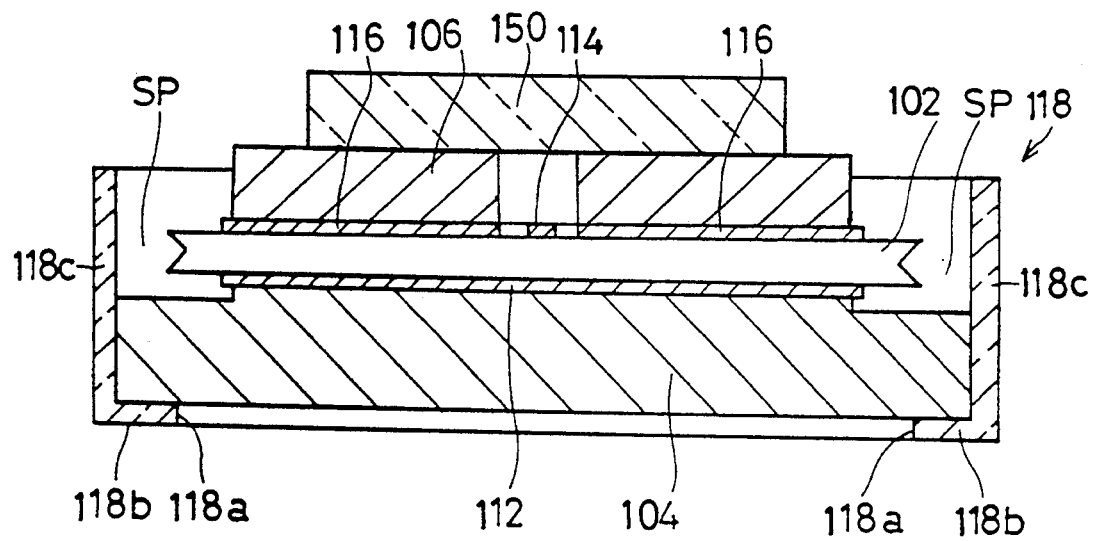

First, the cylindrical insulating member 118 is so placed on a prescribed position as to downwardly direct its stop portion 118b. Then, the anode electrode plate 104 is so engaged in the cylindrical insulating member 118 as to upwardly direct the stepped portion 104a. Further, the semiconductor element 102 is so placed on the anode electrode plate 104 that the anode metallization layer 112 is in contact with the anode electrode plate 104, and thereafter the cathode electrode plate 106 is placed on the cathode metallization layer 116 (FIG. 38). Thus, the space portion SP is defined by the side surface portion 118c of the cylindrical insulating member 118, the semiconductor element 102, the anode electrode plate 104 and the cathode electrode plate 106.

Figure 40:
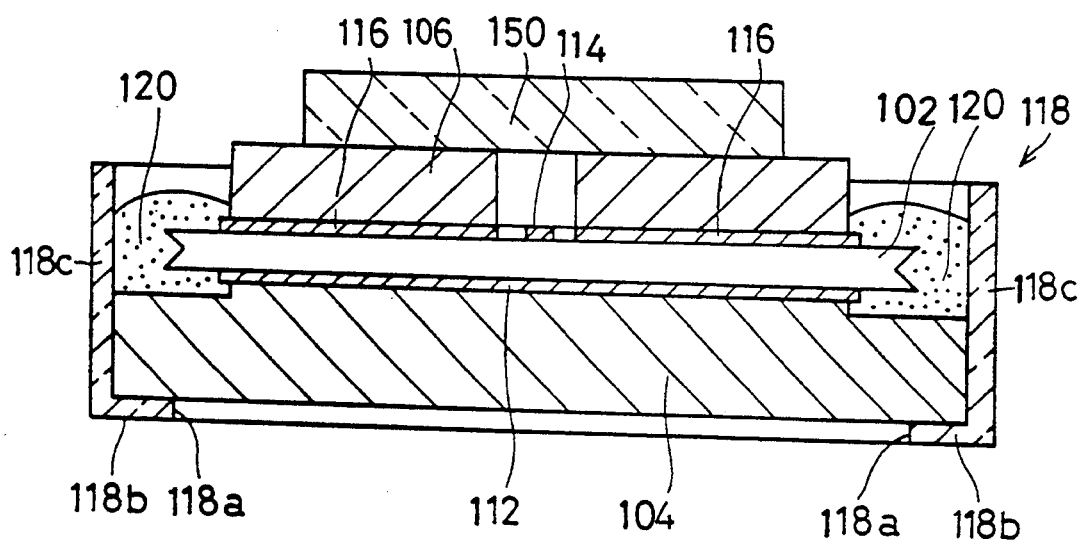

Then, the semiconductor element 102 is fixed similarly to the above. Namely, a weight 150 for preventing displacement is placed on the semiconductor element 102 (FIG. 39), and the adhesive holding member 120 is filled up in the space portion SP in this state, and thereafter the adhesive holding member 120 is solidified by prescribed heat treatment (FIG. 40).

Further, the other end of the side surface portion 118c of the cylindrical insulating member 118 may be located upwardly beyond a horizontal level (one-dot chain line in FIG. 41) of a lower major surface 102b of the semiconductor element 102.

In the aforementioned fixing method, the adhesive holding member 120 being filled up may flow into a clearance between the anode metallization layer 112 and the anode electrode plate 104 by a capillary phenomenon to be solidified therein. In this case, electrical bonding between the anode metallization layer 112 and the anode electrode plate 104 may be made defective. When the flowing adhesive holding member 120 forms a thick film, further, a hollow portion is so formed in the interior that the central portion of the semiconductor element 102 may be deflected and broken in the worst case when a pressure is applied from the exterior of the external anode and cathode electrodes 108 and 110.

Figure 42:
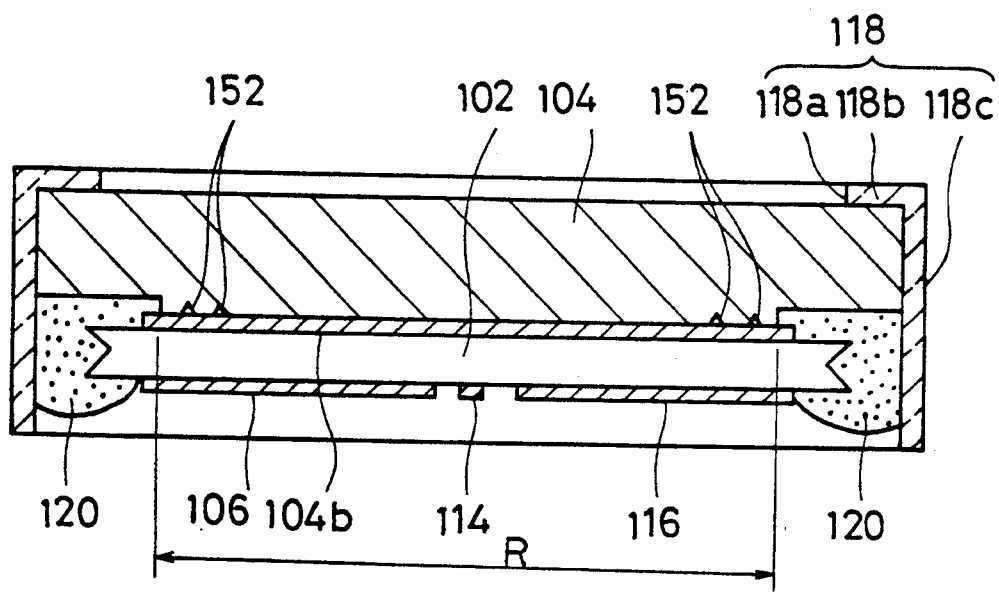
FIG. 42 is a view of an anode electrode plate provided with auxiliary groove.

Such situations can be solved when closed loop type (ring-shaped) grooves 152 are provided in a contact region R of the lower major surface of the anode electrode plate 104 which is in contact with the anode metallization layer 112, as shown in FIG. 42.

Even if the adhesive holding member 120 flows in the clearance between the semiconductor element 102 and the anode electrode plate 104, such inflow is blocked by the portion of the grooves 152 so that no further inflow is made in the interior, whereby the aforementioned problems can be solved.

Although the number of the ring-shaped grooves 152 is not restricted to two as shown in FIG. 42, it may be impossible to completely block inflow of the adhesive holding member 120 if only one groove is provided, while the area of electrical contact with the anode metallization layer 112 is reduced if the number is too large, and hence a number of about two is preferable. Further, the sectional shapes of the grooves 152 are not restricted to the triangular ones shown in the figure but may be modified at need.

Figure 43:
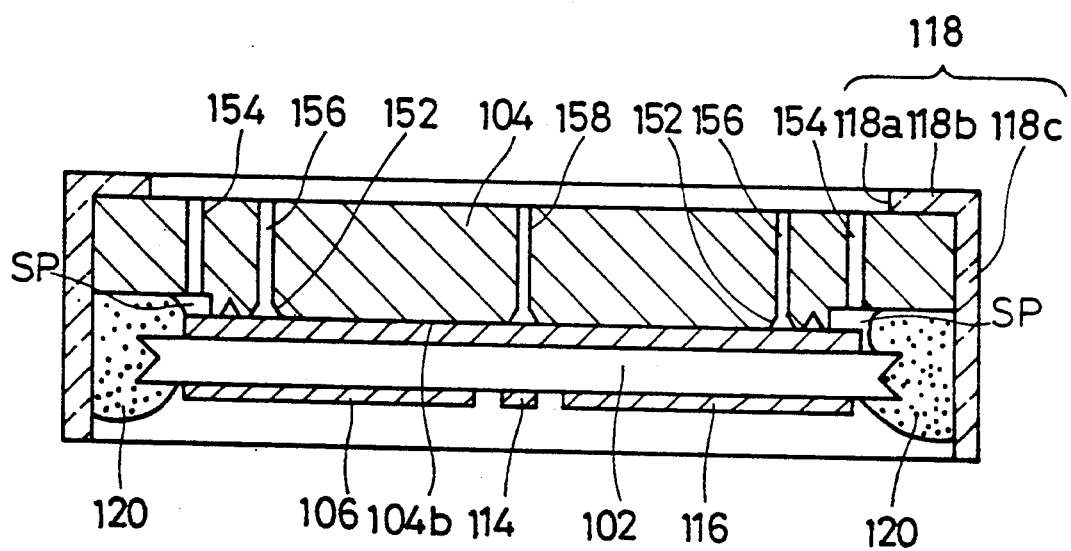
FIG. 43 is a view of an anode electrode plate provided with air vent holes.

On the other hand, air may remain in the clearance between the semiconductor element 102 and the anode electrode plate 104 or gas may be generated in the interior by heating for solidifying the adhesive holding member 120 when the semiconductor element 102 is placed on and fixed to the anode electrode plate 104 and electrical bonding between the semiconductor element 102 and the anode electrode plate 104 is made defective in this case. Therefore, air vent holes 154 passing through the anode electrode plate 104 and communicating with the space portion SP and a similar air vent hole 158 provided in a central portion of the anode electrode plate 104 may be formed as shown in FIG. 43.

Figure 44:
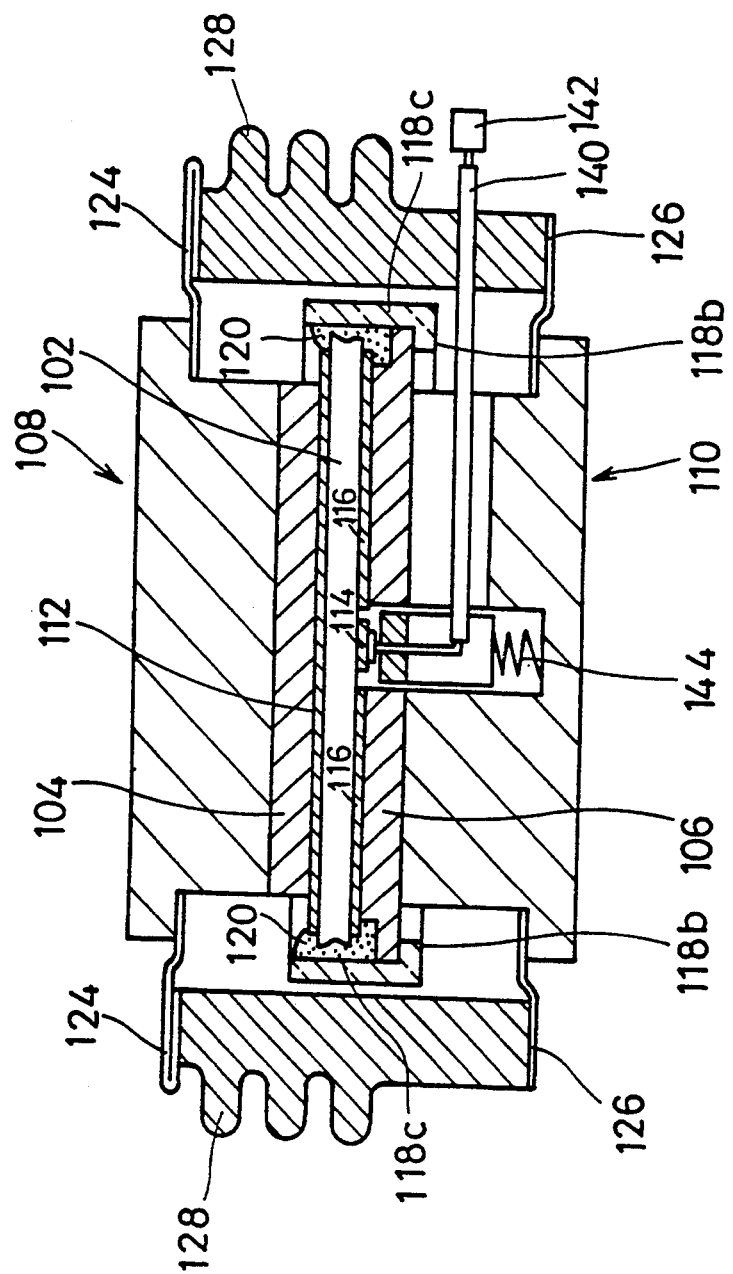
FIG. 44 is a longitudinal sectional view of another embodiment of the semiconductor device according to the present invention.

FIG. 44 is a longitudinal sectional view of another embodiment of the semiconductor device according to the present invention. The semiconductor device of FIG. 44 is extremely different from the semiconductor device of FIG. 21 in that a cylindrical insulating member 118 is engaged with a cathode electrode plate 106. According to the embodiment of FIG. 44, the cathode electrode plate 106 is so finished that its diameter is larger than a semiconductor element 102, while its upper major surface is provided with a ring-shaped notch which is concentric with its outer periphery. A space portion SP is defined by the cylindrical insulating member 118, the cathode electrode plate 106 and the semiconductor element 102 in such a state that the cathode electrode plate 106 is engaged in the cylindrical insulating member 118, so that the space portion SP is filled up with adhesive holding member 120. Other basic structure is similar to that of the embodiment of FIG. 21.

Thus, according to the embodiment of FIG. 44, the semiconductor element 102 is bonded to the cathode electrode plate 106 and the cylindrical insulating member 118 by the adhesive holding member 120, whereby the semiconductor element 102 can be fixed with sufficient bond strength. Further, the space portion SP is filled up with the adhesive holding member 120, whereby the following effects similar to those of the embodiment of FIG. 21 can be attained:

(1) It is possible to improve reliability of the semiconductor device;

(2) it is possible to simplify the fabrication steps; and (3) it is possible to improve the withstand voltage of the semiconductor device.

Figure 45:
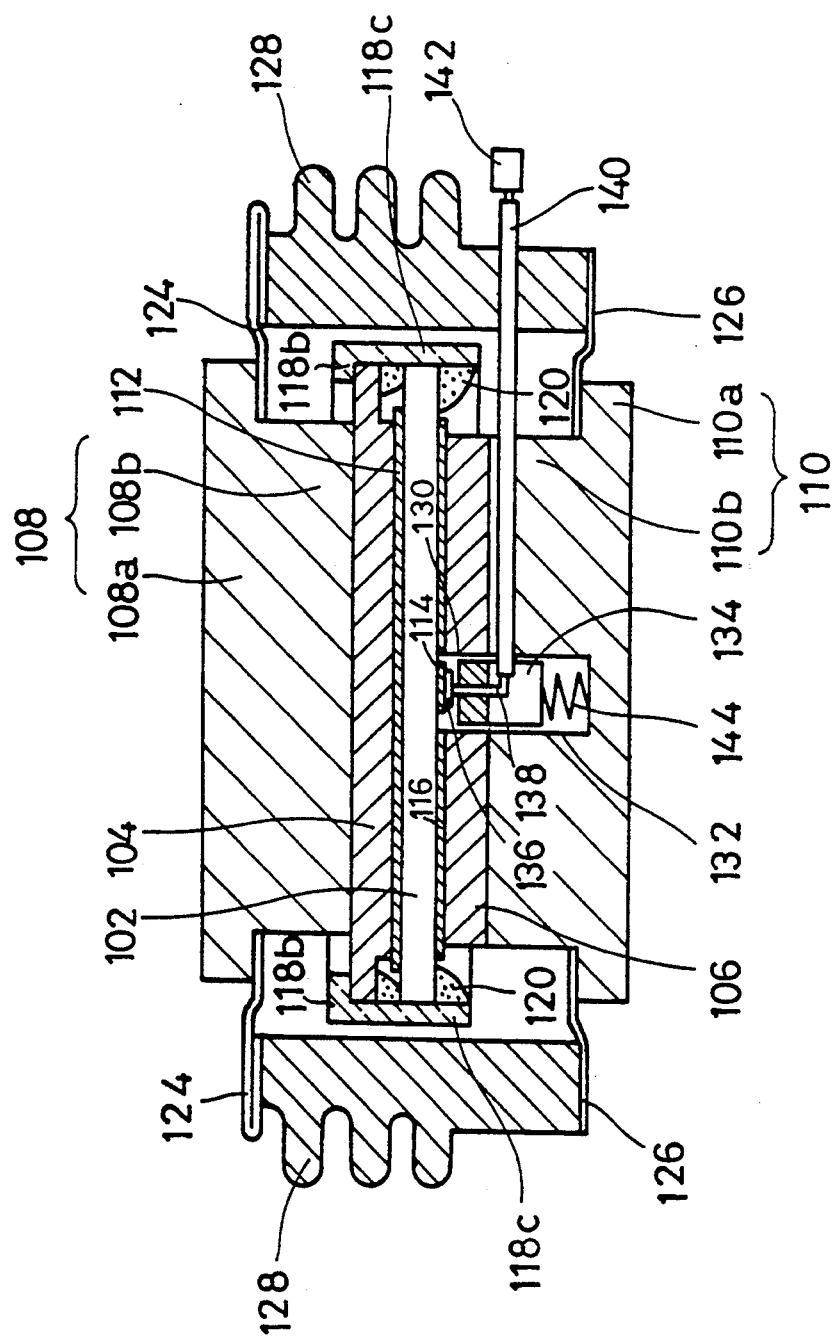
FIG. 45 is a longitudinal sectional view of further another embodiment of the semiconductor device according to the present invention.

FIG. 45 is a longitudinal sectional view of further another embodiment of the semiconductor device according to the present invention. This embodiment is extremely different from the embodiment of FIG. 21 in that a planar type thyristor is formed in the embodiment while a mesa type thyristor is formed on the semiconductor element 102 in the embodiment of FIG. 21, and other basic structure of the former is identical to that of the latter.

Figure 46:
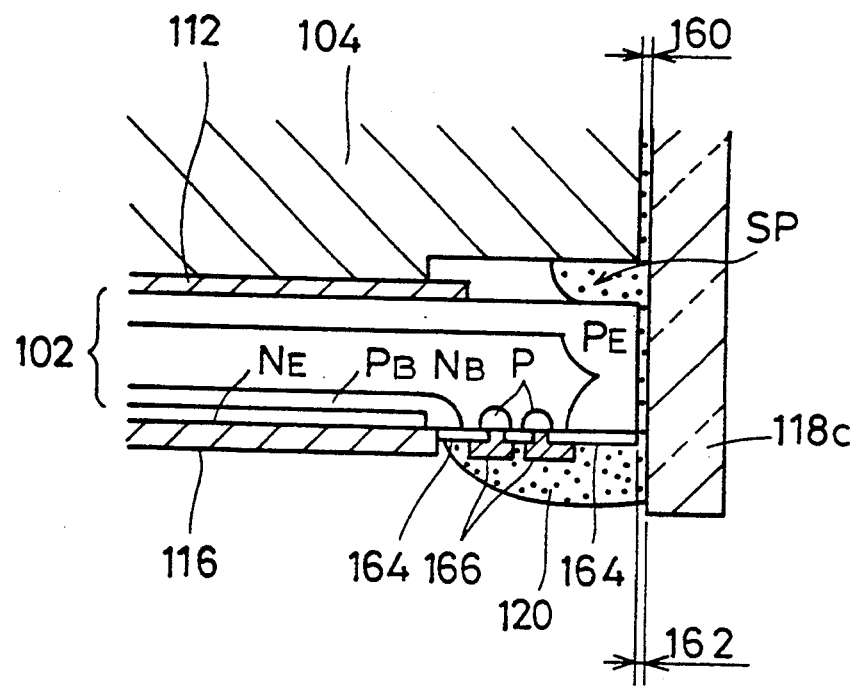
FIG. 46 is a partially enlarged view of the semiconductor device shown in FIG. 45.

FIG. 46 is a partially enlarged view of a semiconductor element 102. This planar type thyristor is formed substantially similarly to the mesa type thyristor, except a point that parts of a P-emitter layer PE and an N-base layer NB are exposed on a lower major surface of the semiconductor element 102 respectively and a point that a P-layer P is formed on the exposed surface of the N-base layer NB. Further, an SiO2 layer 164 is provided on an outer peripheral portion of the lower major surface of the semiconductor element 102, while a field plate 166 for relieving an electric field is provided on the SiO2 layer 164 and electrically connected with the P-layer P through an opening of the SiO2 layer 164. In such a planar type thyristor having a P-N junction exposed on the major surface (lower major surface), it is possible to relatively widely take an interspace between layers exposed on this major surface. Therefore, a bonding action is further important in the planar type while a side surface protecting action by the adhesive holding member 120 is important in the mesa type.

While the diameter of the semiconductor element 102 is made substantially equal to the inner diameter of a cylindrical insulating member 118 according to the third embodiment, clearances 160 and 162 of about 0.1 to 0.2 mm are defined between an anode electrode plate 104 and the cylindrical insulating member 118 and between the semiconductor element 102 and a side surface portion 118c of the cylindrical insulating member 118 respectively, in consideration of the aforementioned bonding action. Further, the adhesive holding member 120 is filled up in the space portion SP and the clearances 160 and 162, to attain an effect similar to that of the aforementioned embodiment. When the field plate 166 for relieving an electric field is provided on the outer peripheral portion of the semiconductor element 102 as shown in FIG. 46, it is preferable not only to fill up the space portion SP with the adhesive holding member 120, but to protect the outer peripheral portion by the adhesive holding member 120.

Figure 47:
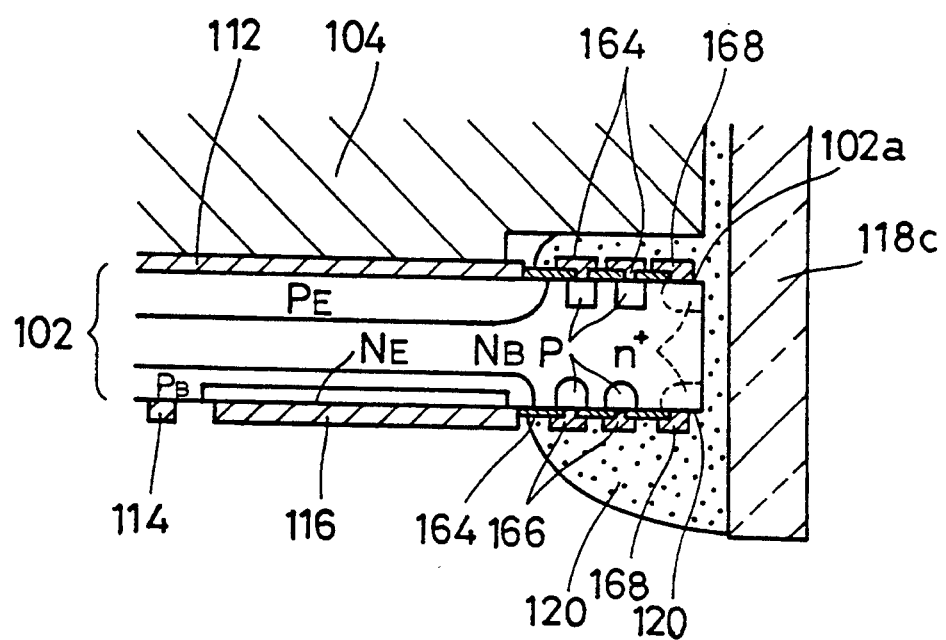
FIG. 47 is a partially enlarged view of still another embodiment of the semiconductor device according to the present invention.

While a planar type thyristor having a P-N junction exposed on one major surface (lower major surface in FIG. 46) of the semiconductor element 102 is described in relation to the aforementioned third embodiment, the present invention is also applicable to a type having P-N junctions exposed on both major surfaces such as a planar thyristor shown in FIG. 47, for example.

Referring to FIG. 47, n+ regions are formed on both major surface sides of an outer peripheral end of the semiconductor element 102, to be electrically connected with a field limit ring 168.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor element having first and second surfaces;
a first electrode provided on said first surface of said semiconductor element;
a second electrode provided on said second surface of said semiconductor element;
a first electrode plate having first and second surfaces, said first surface of said first electrode plate being in contact with said first electrode;
a second electrode plate having first and second surfaces, said first surface of said second electrode plate being in contact with said second electrode;
a first external electrode which contacts said second surface of said first electrode plate;
a second external electrode which contacts said second surface of said second electrode plate; and
an adhesive holding member for fixing said semiconductor element to said first electrode plate, wherein said first electrode plate is formed such that an outer peripheral portion thereof projects outwardly beyond said semiconductor element, wherein a stepped portion is provided on said first surface of said first electrode plate along an outer peripheral portion of said semiconductor element, and wherein said adhesive holding member is charged between said stepped portion and said outer peripheral portion of said semiconductor element, said adhesive holding member protecting said outer peripheral portion of said semiconductor element.

2. A semiconductor device according to claim 1, wherein said semiconductor element and said first electrode plate are designed in a disc configuration.

3. A semiconductor device according to claim 2, wherein a diameter of said first electrode plate is larger than a diameter of said semiconductor element.

4. A semiconductor device according to claim 2, wherein said stepped portion comprises a ring-shaped groove.

5. A semiconductor device according to claim 4, wherein said first electrode plate includes an auxiliary groove which is formed into said first surface of said first electrode plate at positions along said ring-shaped groove.

6. A semiconductor device according to claim 5, wherein said first electrode plate further includes an air vent hole which communicates with said auxiliary groove.

7. A semiconductor device according to claim 1, wherein said second electrode plate has an identical diameter as said second external electrode, and wherein said semiconductor device further comprises a location ring engaged with said second electrode plate and said second external electrode.

8. A semiconductor device according to claim 1, wherein said second electrode plate is formed such that an outer peripheral portion thereof projects outwardly beyond said semiconductor element, wherein a stepped portion is provided on said first surface of said second electrode plate along said outer peripheral portion of said semiconductor element, and wherein said adhesive holding member is charged in said stepped portion of said second electrode plate, whereby said semiconductor element is fixed to said second electrode plate as well as to said first electrode plate.

9. A semiconductor device comprising:
a semiconductor element having first and second surfaces;
a first electrode provided on said first surface of said semiconductor element;
a second electrode provided on said second surface of said semiconductor element;
a first electrode plate having a first surface and a second surface, said first surface of said first electrode plate contacting said first electrode;
a second electrode plate having an outer dimension which is larger than said first electrode plate, said second electrode plate having a first surface and a second surface, said first surface of said second electrode plate contacting said second electrode; and
an insulating member engaged with an outer peripheral portion of said second electrode, wherein a space portion is defined by said insulating member, said second electrode plate, and said semiconductor element, said space portion being filled with an insulating bonding member so that said semiconductor element is fixed to at least said second electrode plate and said insulating member while an outer peripheral end portion of said semiconductor element is protected by said insulating bonding member.

10. A semiconductor device according to claim 9, wherein an outer peripheral portion on said first surface of said second electrode plate comprises a stepped portion.

11. A semiconductor device according to claim 10, wherein an end portion of said insulating member extends to said stepped portion of said second electrode plate.

12. A semiconductor device according to claim 11, wherein said semiconductor element is provided with pn junctions which are exposed on both of said first and second surfaces of said semiconductor element thereby defining exposed portions, and wherein an exposed portion of said second surface of said semiconductor element is opposed to said stepped portion of said second electrode plate.

13. A semiconductor device comprising:
a semiconductor element having first and second surfaces;
a first electrode provided on said first surface of said semiconductor element;
a second electrode provided on said second surface of said semiconductor element;
a first electrode plate having a first surface and a second surface, said first surface of said first electrode plate contacting said first electrode;
a second plate having an outer dimension which is larger than said first electrode plate, said second electrode plate having a first surface and a second surface, said first surface of said second electrode plate contacting said second electrode; and
an insulating member engaged with an outer peripheral portion of said second electrode, wherein a space portion is defined by said insulating member, said second electrode plate, and said semiconductor element, said space portion being filled with an insulating bonding member so that said semiconductor element is fixed to at least said second electrode plate and said insulating member while an outer peripheral end portion of said semiconductor element is protected by said insulating bonding member, and wherein an outer peripheral portion of said second electrode plate comprises a through-hole which communicates said space portion with said second surface of said second electrode plate.

14. A semiconductor device comprising:
a semiconductor element having first and second surfaces;
a first electrode provided on said first surface of said semiconductor element;
a second electrode provided on said second surface of said semiconductor element;
a first electrode plate having a first surface and a second surface, said first surface of said first electrode plate contacting said first electrode;
a second electrode plate having an outer dimension which is larger than said first electrode plate, said second electrode plate having a first surface and a second surfacer said first surface of said second electrode plate contacting said second electrode; and
an insulating member engaged with an outer peripheral portion of said second electrode, wherein a space portion is defined by said insulating member, said second electrode plate, and said semiconductor element, said space portion being filled with an insulating bonding member so that said semiconductor element is fixed to at least said second electrode plate and said insulating member while an outer peripheral end portion of said semiconductor element is protected by said insulating bonding member, and wherein said first surface of said second electrode plate includes a contact region, said contact region comprising at least one closed loop groove which contacts said second electrode.

15. A semiconductor device according to claim 14, wherein said second electrode plate comprises a through-hole which communicates said at least one closed loop groove with said second surface of said second electrode plate.

16. A semiconductor device comprising:
a semiconductor element having first and second surfaces;
a first electrode provided on said first surface of said semiconductor element;
a second electrode provided on said second surface of said semiconductor element;
a first electrode plate having a first surface and a second surface, said first surface of said first electrode plate contacting said first electrode;
a second electrode plate having an outer dimension which is larger than said first electrode plate, said second electrode plate having a first surface and a second surface, said first surface of said second electrode plate contacting said second electrode; and
an insulating member engaged with an outer peripheral portion of said second electrode, wherein a space portion is defined by said insulating member, said second electrode plate, and said semiconductor element, said space portion being filled with an insulating bonding member so that said semiconductor element is fixed to at least said second electrode plate and said insulating member while an outer peripheral end portion of said semiconductor element is protected by said insulating bonding member, wherein said first surface of said first electrode plate comprises a first contact region which contacts said first electrode, and said second surface of said first electrode plate comprises a second contact region which contacts said second electrode, said second contact region having a larger outer diameter than said first contact region, and wherein a projected region, defined by projecting said first contact region onto said first surface of said second electrode plate, is positioned within said second contact region.

17. A semiconductor device comprising:
a semiconductor element having first and second surfaces;
a first electrode provided on said first surface of said semiconductor element;
a second electrode provided on said second surface of said semiconductor element;
a first electrode plate having a first surface and a second surface, said first surface of said first electrode plate contacting said first electrode;
a second electrode plate having an outer dimension which is larger than said first electrode plate, said second electrode plate having a first surface and a second surface, said first surface of said second electrode plate contacting said second electrode; and
an insulating member engaged with an outer peripheral portion of said second electrode, wherein a space portion is defined by said insulating member, said second electrode plate, and said semiconductor element, said space portion being filled with an insulating bonding member so that said semiconductor element is fixed to at least said second electrode plate and said insulating member while an outer peripheral end portion of said semiconductor element is protected by said insulating bonding member, and wherein an outer dimension of said semiconductor element is smaller than that of said second electrode plate and smaller than an inner dimension of said insulating member, said semiconductor element being provided with a pn junction a part of which is exposed on said outer peripheral end portion of said semiconductor element.

18. A semiconductor device comprising:

a semiconductor element having first and second surfaces;

a first electrode provided on said first surface of said semiconductor element;

a second electrode provided on said second surface of said semiconductor element;

a first electrode plate having a first surface and a second surface, said first surface of said first electrode plate contacting said first electrode;

a second electrode plate having an outer dimension which is larger than said first electrode plate, said second electrode plate having a first surface and a second surface, said first surface of said second electrode plate contacting said second electrode; and an insulating member engaged with an outer peripheral portion of said second electrode, wherein a space portion is defined by said insulating member, said second electrode plate, and said semiconductor element, said space portion being filled with an insulating bonding member so that said semiconductor element is fixed to at least said second electrode plate and said insulating member while an outer peripheral end portion of said semiconductor element is protected by said insulating bonding member, wherein said semiconductor element is provided with a pn junction which is exposed on said first surface of said semiconductor element, and wherein an outer dimension of said semiconductor element is substantially equal to that of said second electrode plate.

19. A semiconductor device comprising:

a semiconductor element having first and second surfaces;

a first electrode provided on said first surface of said semiconductor element;

a second electrode provided on said second surface of said semiconductor element;

a first electrode plate having a first surface and a second surface, said first surface of said first electrode plate contacting said first electrode;

a second electrode plate having an outer dimension which is larger than said first electrode plate, said second electrode plate having a first surface and a second surface, said first surface of said second electrode plate contacting said second electrode; and an insulating member engaged with an outer peripheral portion of said second electrode, wherein a space portion is defined by said insulating member, said second electrode plate, and said semiconductor element, said space portion being filled with an insulating bonding member so that said semiconductor element is fixed to at least said second electrode plate and said insulating member while an outer peripheral end portion of said semiconductor element is protected by said insulating bonding member, wherein said semiconductor element is provided with a pn junction which is exposed on at least one of said first and second surfaces of said semiconductor element thereby defining an exposed region, a ring-shaped field relieving region is provided on an outer peripheral portion of said exposed region, and a metal film is formed and connected with a part of said ring-shaped field relieving region, said insulating bonding member covering said metal film.

* * * * *